United States Patent [19]
Curran

[11] Patent Number: 4,717,681
[45] Date of Patent: Jan. 5, 1988

[54] METHOD OF MAKING A HETEROJUNCTION BIPOLAR TRANSISTOR WITH SIPOS

[75] Inventor: Patrick A. Curran, Plano, Tex.

[73] Assignee: Texas Instruments Incorporated, Dallas, Tex.

[21] Appl. No.: 864,671

[22] Filed: May 19, 1986

[51] Int. Cl.$^4$ .................... H01L 21/265; H01L 29/72
[52] U.S. Cl. .......................................... 437/31; 437/68; 437/106; 437/126; 437/196; 437/203; 357/34; 427/51; 156/614
[58] Field of Search ............... 29/576 E; 148/1.5, 174, 148/175, DIG. 10, 11, 147, 19, 169; 156/610–614; 204/192; 427/87, 38; 357/16, 34

[56] References Cited

U.S. PATENT DOCUMENTS

| | | | |
|---|---|---|---|
| 3,394,289 | 7/1968 | Lindmayer | 148/175 |
| 3,488,235 | 1/1970 | Walczak et al. | 148/175 |
| 3,878,552 | 4/1975 | Rodgers | 357/34 |
| 3,913,124 | 10/1975 | Roberson | 357/34 |
| 3,974,560 | 8/1976 | Mueller et al. | 357/34 |
| 4,051,506 | 9/1977 | Horie | 357/34 |
| 4,269,636 | 5/1981 | Rivoli et al. | 148/175 |
| 4,392,453 | 7/1983 | Luscher | 118/726 |
| 4,420,874 | 12/1983 | Funatsa | 29/576 W |
| 4,428,111 | 1/1984 | Swartz | 29/576 E |
| 4,498,226 | 2/1985 | Inoue et al. | 29/576 B |
| 4,559,091 | 12/1985 | Allen et al. | 148/174 |
| 4,569,121 | 2/1986 | Lim et al. | 29/576 E |
| 4,593,457 | 6/1986 | Birrittella | 357/34 |
| 4,599,792 | 7/1986 | Cade et al. | 29/576 E |
| 4,613,382 | 9/1986 | Katayama et al. | 148/1.5 |
| 4,622,093 | 11/1986 | Tsang | 156/610 |
| 4,644,381 | 2/1987 | Shieh | 357/34 |
| 4,654,960 | 4/1987 | McLevige et al. | 357/34 |
| 4,663,831 | 5/1987 | Birrittella et al. | 357/34 |
| 4,670,767 | 6/1987 | Ohta | 357/34 |

OTHER PUBLICATIONS

R. T. Tung et al., "Epitaxial Silicides", Thin Solid Films; 93 (1982) 77–90.
S. K. Ghandhi, "VLSI Fabrication Principles", John Wiley & Sons, New York, N.Y., 1983, pp. 231–234.
S. P. Mararka, "Silicides for VLSI Applications", Academic Press, New York, N.Y., 1984, pp. 172–175.
T. J. Maloney, "MBE Growth . . .", J. Vac. Sci. Technol., B, vol. 1, No. 3, Jul.-Sep. 1983.
Y. Shiraki, "Silicon Molecular Beam Epitaxy", J. Vac. Sci. Tech. B, 3(2), Mar./Apr. 1985, pp. 725–729.
Matsushita et al., "A Silican Heterojunction Transistor", Appl. Phys. Lett., 35(7), Oct. 1, 1979, pp. 549–550.
DeClercq et al., "V-Groove-Isolated I.I.L. Circuits", Electronics Letters, Mar. 18, 1976, vol. 12, No. 6, pp. 150–151.
Kroemer, "Heterostructure Bipolar Transistors and Integrated Circuits", Proceedings of IEEE, vol. 70, No. 1, Jan. 1, 1982, pp. 13–25.

Primary Examiner—Brian E. Hearn
Assistant Examiner—William Bunch
Attorney, Agent, or Firm—Gary C. Honeycutt; N. Rhys Merrett; Mel Sharp

[57] ABSTRACT

A wafer process flow encompasses an arbitray repeated layered structure of heteroepitaxial layers of silicon based films with process control throughout the strata of chemical potential and recombination velocity, suitable for both high performance MOS and bipolar transistors with three dimensional transistor capability. A non-compensated doping technique preserves crystalline periodicity, as does the component delineation by means of anisotropic etching. The wafer is hermetic by means of the semi-insulation films polyimide, and the elimination of phosphorous doped silicon dioxide. A metallurgy system enables a high level integration.

5 Claims, 19 Drawing Figures

METHOD OF MAKING A HETEROJUNCTION BIPOLAR TRANSISTOR WITH SIPOS

BACKGROUND OF THE INVENTION

1. Field of the invention

This invention relates to improvements in semiconductor devices and structures and methods for making them.

2. Description of the prior art

Although many electronic functions can be integrated by high level majority carrier MOS technology, there is a wide class of applications that cannot be realized by MOS technology. Minority carrier technology has a fundamental superiority in blocking high voltages in the off-state and providing high current density and high transconductance in the on-state by means of conductivity modulation of the blocking region. Bipolar devices exhibit high speed and are advantageous in precision electronic applications. Deleterious minority carrier effects, for example, speed limitations due to charge storage and secondary breakdown, as well as the heretofore inability to locally control minority carrier transport, have impeded minority carrier technology.

Virtually all modern silicon semiconductor devices are built on a planar surface commencing with a single crystal substrate or a substrate with slightly doped epitaxial layer. Bipolar base regions (or MOS source and drain regions) are formed by selectively injecting excess dopants to compensate the epitaxial film in order to yield the desired net dopant compensation. The emitter region is formed by a second excess dopant compensation in the base to achieve the desired emitter net dopant compensation. Classical isolation is achieved by selective excess dopant compensation of the collector epitaxial region followed by a long diffusion drive-in. Excess dopant compensation can be realized by ion implantation or chemical deposition followed by a diffusion drive.

Junction isolation limits voltage operation to 100-200 volts. High temperature anneals (>1000° C.) is ordinarily utilized to drive in the dopants or to electrically activate the ion implants. Selectively is typically accomplished by patterning a thermal oxide and utilizing an oxide mask to block the deposition or ion implant from entering the crystalling surface. Hence, diffusions are normally performed in an oxidizing ambient in order to grow a diffusion mask for subsequent depositions. The oxide layer also forms a dielectric layer between the planar silicon surface and the ambient. A thin, thermal silicon dioxide layer electrically improves the abrupt termination of the periodic crystalline lattice by forming an $SiO_x$ region that ties up dangling bonds.

The excess dopant compensation approach alters the naturally occurring scheme of events in that, while accomplishing the desired net doping level, the crystalline lattice periodicity is excessively perturbed by the additional dopant atoms. This is particularly deleterious to minority carrier operation. Interstitial atoms are introduced into the lattice and strain dislocations occur to relieve stress from excess dopant atoms. Although the electrical characteristics are determined in the first order by the net impurities, the crystal characteristics are determined by the total impurity level. The thermal oxidation process introduces further stress and resulting lattice dislocations. In order to enhance diffusion of dopants into silicon, as well as to grow silicon dioxide masking layers, high temperature anneals are employed (typically 1000° C. and higher). The high temperatures, as well as the temperature transitions, introduce further stress damage to the lattice. Additionally, the high temperatures enhance the diffusivity of undesirable impurities into the silicon lattice which further degrade semiconductor performance. Essentially, the excess dopant compensation technique perturbs naturally occurring crystalline perfection, and correspondingly, limits semiconductors performance.

Although the introduction of the planar processing concept over 25 years ago had an amazing impact on the introduction of integrated circuits, it is believed that planar processing will impose limitations on future semiconductor capability. Planar processing generally limits the wafer to one lightly doped epitaxial region which constrains all transistors to be of similar current-voltage capability. Planar processing forces vertical introduction of excess dopants into the planar surface by ion implantation or diffusion with an oxide mask. The vertical dopant introduction limits the vertical penetration range of net excess dopant compensation and restricts transistor operation to near the planar surface. Attempts to increase vertical dopant penetration result in increased lattice damage which degrades semiconductor performance. Planar processing results in planar surface termination of depletion layers which builds in a surface sensitivity and yield degradation. Planar devices are particularly sensitive to the masking operation which can cause surface defects. Planar devices are also sensitive to oxide quality and surface charge reflection through the oxide. Consequently, planar device reliability tends to be very dependent on ion control, particularly sodium and halides. Moreover, non-silicon based compound semiconductors have severe materials, electrical, and cost limitations in many applications.

SUMMARY OF THE INVENTION

In light of the above, it is therefore, an object of the invention to provide a process for the fabrication of ideal minority carrier devices simultaneously with majority carrier devices with the additional capability of three dimensionally cascading such components.

It is another object of the invention to provide a process of the type described which does not utilize the planar excess dopant compensation technique prevalent in most silicon semiconductor processes.

It is another object of the invention to provide a process of the type described which permits monolithic integration of digital logic, precision linear functions, power components, and high voltage precision linear functions, power components, and high voltage functions, which all can be integrated with fully complementary components.

It is another object of the invention to provide a process of the type described which tends towards wafer scale integration with very high yields on large die and can be employed on very large diameter wafers at low temperature processing for maximum semiconductor economy.

In accordance with a broad aspect of the invention, a non-planar silicon-based multiple epitaxial technique is presented in lieu of classical planar excess dopant compensation. The epitaxial strata may be grown at or below atmospheric pressure by chemical vapor deposition techniques or in an ultra high vacuum by molecular beam deposition techniques. (The chemical vapor deposition approach is a subset of the more general vacuum processing approach, which is compatible with atomic control at low deposition temperatures (<700° C.)). The epitaxial deposition technique preserves lattice perfection by virtually eliminating interstitial atoms and dislocations. All oxidations are effectively eliminated to further reduce dislocation effects. All epitaxial growth is performed in an ultra high vacuum at temperatures less than 700° C. in order to reduce undesirable impurity diffusivities. All transistors are delineated by precise crystallographic etching to preserve lattice perfection. All active junctions and depletion regions are buried to reduce surface and masking defects. Three dimensional transistor fabrication is achievable, and individual MOS, bipolar, and JFET transistors can be uniquely processed to conform to particular circuit requirements. Switching, analog, and power functions can be fabricated simultaneously in harmony. Complementary transistors of all types can be fabricated with improved yields and reliability, increased component precision, and compatibility with large diameter wafer processing.

Thus, in practicing the invention, a method for making transistor includes the steps of epitaxially growing a plurality of epitaxial strata on a silicon substrate at or below atmospheric pressure by chemical vapor deposition and elineating all transistors by precise crystallographic etching. The strata are formed entirely of single crystal materials and the junctions are all formed to be abrupt anisotype homojunctions. Alternatively, the epitaxial growing step can be performed in an ultra high vacuum by molecular beam deposition techniques at temperatures less than 700° C. All active junctions and depletion regions are buried to reduce surface and masking defects.

The epitaxial strata are constructed by the reduction of a halogenated silicon gas, such as dichlorosilane in a chemical vapor deposition reaction in the presence of a doping gas, such as diborane or phosphine, to non-compensatingly uniformly dope the respective epitaxial layers, at atmospheric pressure at temperatures above 1000° C.

The transistor structure of the invention includes a plurality of epitaxial strata on a silicon substrate, each strata having abrupt isotype or anisotype homojunctions therebetween, and means for burying all active junctions and depletion regions to reduce surface and masking defects. The transistor structure is fabricated on a wafer of float zone single crystal silicon wafer uniformly doped and normally of <100> orientation, and each of the epitaxial strata is of highly uniform (1%) with very abrupt transition regions (<100Å) and with minimal diffusion of impurities or interstitials in the lattice. A single crystal transition metal silicide, such as $NiSi_2$ or $CoSi_2$, is provided to lower the majority carrier resistivity of the deposited films overlying the structure, and an oxygen doped semi-insulating polycrystalline silicon film is provided for passivating and contacting the epitaxial regions.

Thus, a wafer process flow In accordance with the invention encompasses an arbitrary repeated layered structure of heteroepitaxial layers of silicon based films with process control throughout the strate of chemical potential and recombination velocity. The proposed strata is suitable for both high performance MOS and bipolar transistors with three dimensional transistor capability. The non-compensated doping technique preserves crystalline periodicity, as does the component delineation by means of anisotropic etching. The wafer can be made hermetic by means of the semi-insulating films polyimide, and the elimination of phosphorous doped silicon dioxide. The concept comprehends a complex metallurgy system for high level integration.

BRIEF DESCRIPTION OF THE DRAWING

The invention is illustrated in the accompanying drawing, in which.

In the various views of the drawing, like reference numerals are used to denote like or similar parts.

DETAILED DESCRIPTION OF THE PREFERRED EMBODIDMENT(S)

The transistors formed in accordance with the invention have a multilayer epitaxial strata, formed with each layer being uniformly doped by non-compensation tecniques. This may be accomplished by the reduction of a halogenated silicon gas, such as dichlorosilane, in a chemical vapor deposition (CVD) reaction in the presence of a gaseous doping species, such as diborane or phosphine at atmospheric pressure at temperatures above 1000° C. In one form, the strata is entirely single crystal silicon and the junctions are abrupt isotype or anisotype homojunctions.

Preferably, the structure is fabricated by ultra high vacuum (UHV) beam processing. The starting material can be a float zone or Czorchalski grown single crystal silicon wafer which is uniformaly doped and of <100> orientation, which has been first chemically cleaned, then cleaned with ion sputtering or the like in an ultra high vacuum to remove critical surface contaminants like carbon. In such ion bombardment the wafers can be bombarded, for example, by low energy (1 KEV) argon ions for 1-2 minutes followed by a 10 minute anneal at 850° C. The wafer is then transferred for fabrication of transistor structures in accordance with the invention to an UHV molecular beam deposition chamber, such as the molecular beam deposition chamber 10 shown in FIG. 1.

Figure 1:
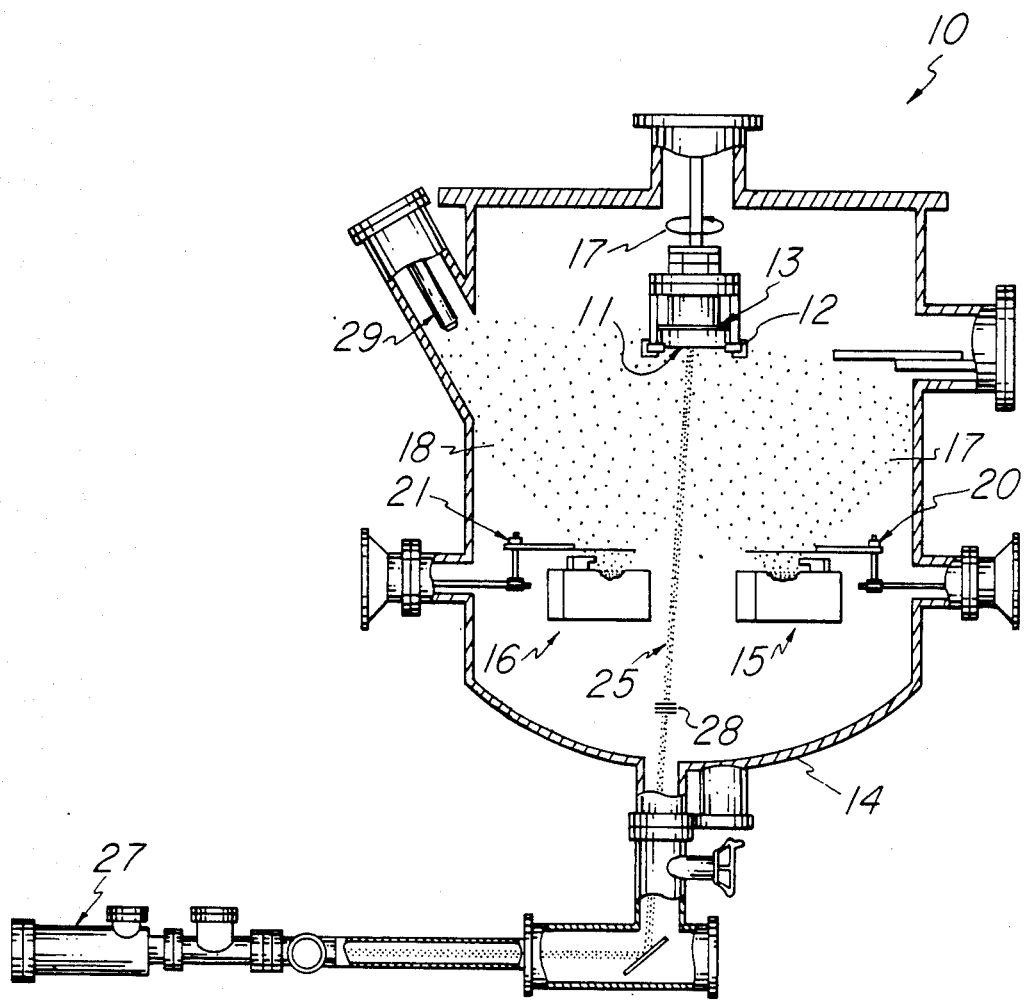
FIG. 1 is a cut-away elevation view of a molecular beam epitaxial reactor which can be used in the fabrication of transistors in accordance with the invention.

As shown, with reference now to FIG. 1, a silicon wafer 11 is mounted on a platform 12 within a chamber 14 and is heated by a heater 13. The wafer 11 is rotated by means (not shown) as indicated by the arrow 17 to enhance deposition and processing uniformity. A plurality of electron beam evaporators or sources 15 and 16 each direct controlled beams of atoms 17 and 18, respectively, upwards towards the rotating wafer 11. (Although two evaporators are shown, it will be understood that any number of evaporators may be employed). Crystalline sources (not shown) such as silicon and germanium and metallic sources such as titanium, nickel, cobalt, or the like, are normally employed in conjunction with the evaporators 15 and 16. The electron-beam sources 15 and 16 have respective shutters 20 and 21 to interrupt the molecular beams 17 and 18 for abrupt transitions, as well as for closed loop control of the beam fluxes. Additional beams can be directed simultaneously towards the specimen from Knudsen cells or low energy ion implantation sources (not shown), if desired.

An ion beam 25 is generated by an ion source 27, and is controlled by a deflection plate 28 to bombard the wafer 11. To determine the thickness of material being deposited on the wafer 11, a thickness monitor 29 can be provided, as shown.

The preferred method for fabricating the structure, in accordance with the invention is by ion implantation, due to improved dopant control which can be achieved by performing the implantation at low energy, such as 1 KEV, the sticking coefficient is unity for the dopant species, and the lattice penetration and lattice damage is minimized. Dopants, such as boron or phosphorous, and critical atoms, such as oxygen and nitrogen, can be implanted. Control of the beams impinging on wafer from electron beam evaporation and ion implantation sources produce the stoichiometry or electrical doping levels required for desired films. The ultra high vacuum, in combination with substrate heating, enhances the movement of the atoms to the proper crystallographic site in the lattice, enhancing lattice perfection and ultimately device performance.

By means of molecular beam deposition in the manner illustrated in FIG. 1, epitaxial films of high uniformity (1%) and precise atomic control can be grown with very abrupt transition regions (<100 Å) and with minimal diffusion of impurities or interstitials into the lattice. Molecular beam deposition also enhances materials integration and heteroepitaxial film growth. Heteroepitaxial films with similar lattice constants can be fabricated. Lower deposition temperatures also alleviate thermal stresses between films with non-identical thermal expansion coefficients. Metals, polycrystalline films, and amorphous dielectrics can also be deposited in an ultra high vacuum by molecular beam deposition.

The multilayer epitaxial strata is grown in a non-compensated manner by means of molecular beam deposition. In general it is desirable to utilize non-degenerate films in order to take full advantage of the crystal potential. Since the maximum dopant concentration is bounded in a non-degenerate crystalline, the conductivity of the films is also limited. In order to achieve higher lateral conductivity in the buried strata, transition metal silicides are employed. In an ultra high vacuum utilizing molecular beam deposition, it is possible to deposit single crystal transition metal silicides (such as $NiSi_2$, $CoSi_2$, etc.) in order to lower the majority carrier resistivity.

Figure 2:
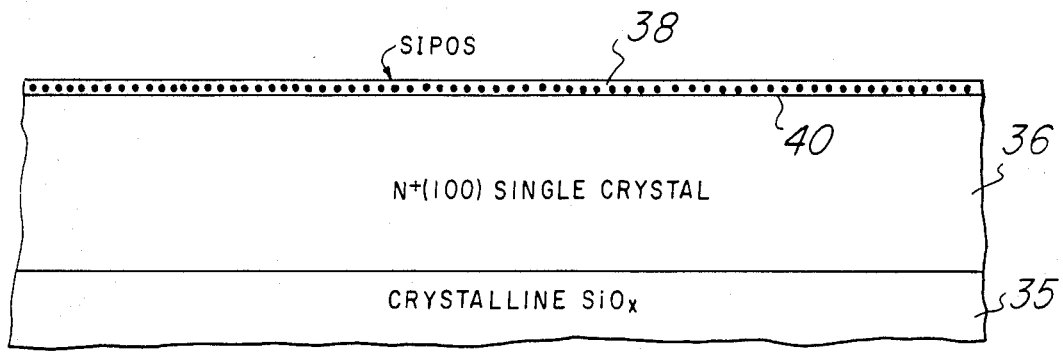
FIG. 2 is a side elevation view in cross section of a $N^+ <100>$ crystal $SiO_x$ having a "SIPOS" layer thereover, in the fabrication of transistor structures formed in accordance with the invention.

As shown in FIG. 2, the structure is formed on a substrate of crystalline $SiO_x$ 35 having an overlying N+ <100> single crystal layer 36. The single crystal regions 35 and 36 are passivated and contacted by oxygen doped semi-insulating polycrystalline silicon films (SIPOS) 38 known in the art. SIPOS films 38 are deposited conventionally at low temperatures (620° C.) by low pressure chemical vapor deposition of silane and nitrous oxide. The films 38 may be deposited undoped or doped, by in-situ inclusion of a doping gas such as phosphine. Alternately, SIPOS films 38 can be fabricated by molecular beam deposition with simultaneous electron beam evaporation of silicon and ion implantation of oxygen and ion implantation of dopants, such as phosphorous, if desired. The dopants can be electrically activated by means of rapid thermal annealing.

An undoped SIPOS film can be considered a system of crystalline grains of silicon with saturated oxygen and a surrounding partial oxide between grains. The grain size and the oxide composition are controlled by the oxygen concentration, the deposition temperature, and the annealing conditions. The grain size is usually small (10 Å–300 Å) and the crystals are totally depleted of electrical carriers due to the interface traps at the crystal boundaries. Normally the SIPOS films are formed by low pressure chemical vapor deposition of silane and nitrous oxide in an inert carrier gas at temperatures between 600° C. and 700° C. The oxygen concentration in the film can be varied by the silane to nitrous oxide ratio. At lower deposition temperatuires and higher oxygen concentrations, the films are essentially amorphous with silicon microcrystals in a sea of partially oxidized silicon compounds ($Si_2O$, $SiO$, and $Si_2O_3$ and amorphous silicon dioxide. Oxygen concentrations are typically between 10–40% by volume. Consequently, upon annealing the oxygen tends to segrate out since it is well above the solid solubility in silicon. Since the SiO bond is favored over the Si-Si bound, microcrystalline silicon grains are formed in a sea of $SiO_2$ with a surrounding Si-O bond that maximizes the granular surface area. Higher annealing temperatures form larger silicon grains with thicker intergranular dielectric. Upon annealing, the total oxygen and silicon concentrations remain constant but the grain structure is modified. The degree of grain growth upon subsequent annealing is heavily dependent upon the as-deposited growth conditions (temperature, oxygen concentration, dopants, substrate cleanliness, interfacial oxide, etc.) A silicon dioxide (not shown) forms at the SIPOS-Si interface 40 and at top of the SIPOS film 38. Dopants can also be included and will electrically dope the microcrystalline grains upon electrical activation by annealing.

The large number of traps in the inter-granular dielectric with energies near midband tend to deplete the small silicon grains, even at relative high doping levels. The intergranular oxide barrier varies between 2–10 Å depending on the film oxygen concentration (10–40%). Depletion of the grains forces the Fermi level near the midgap energy and the grains act like intrinsic crystals. Conduction occurs by means of tunneling through the oxide barrier, which is enhanced if the oxide is doped. The conductivity of the film is ohmic for applied field <105 V/cm and is field dependent at higher fields. The oxygen concentration controls the oxide barrier and thereby the conductivity. As a result, the SIPOS film 38 is semi-insulating with conduction controlled by the oxygen concentration and applied bias voltage, the SIPOS-Si interface forms a heterojunction with a high bandgap SIPOS (about 1.7 eV) and a smaller bandgap silicon (1.12 eV). Since the SIPOS Fermi level is constrained near midband, there is minimal change in the charge at the SIPOS-Si interface, unlike the case for the $SiO_2$-Si interface. Consequently, the SIPOS film 38 forms a passivating film for silicon that does not modulate the silicon Fermi level near the surface 40. Moreover, charges on the SIPOS surface will induce low leakage currents through the film and thereby prevent charge reflection through the film and the accompanying inversion layer in the silicon surface. The oxygen associated with the SIPOS film 38 creates a relatively low recombination velocity (typically 200 cm/sec) at the SIPOS-Si interface 40 that is immune to surface potential variations. Moreover, the SIPOS film 38 forms a heterojunction with silicon that enhances majority carrier transmission across the SIPOS-SI boundary 40 but reflects minority carriers in the silicon at the boundary.

By means of molecular beam deposition in an ultra high vacuum it is possible to grow single crystal SIPOS over monocrystalline silicon with nearly identical lattice structure to the underlying silicon. The silicon deposition rate is controlled by the E-beam evaporated silicon flux, the vacuum pressure, and the substrate temperature. The oxygen concentration is controlled by oxygen flux (ion implanted atomic oxygen) and the substrate temperature. As the temperature increases, oxygen tends to desorb from the substrate surface. Above 850° C. most oxygen is desorbed and pure silicon tends to grow. Hence the oxygen concentration in the $SiO_x$ film 35 is controlled by the relative silicon and oxygen fluxes, the vacuum level, and the substrate temperature.

As previously stated, the $SiO_x$ film 35 can be formed of silicon and silicon dioxide as well as partial silicon oxides: $Si_2O$, $SiO$, and $Si_2O_3$. The preferred state is the segregation of oxygen from silicon to form silicon dioxide. The oxygen is ion implanted during silicon evaporation with sufficiently low energy so as to place the oxygen atoms several atomic layers (50–100 Å) below the lattice growth front but with insufficient energy to disrupt lattice crystallinity. For oxygen concentration between 25–30% in a high vacuum, then the $SiO_x$ film 35 will form with generally the same periodicity as the underlying crystal. Upon higher temperature annealing, the film will transform to SIPOS in a similar manner as previously described and will lose its crystallinity. However, while in the crystalline form, single crystal silicon can be deposited over the $SiO_x$ formation, due to nucleation on the undamaged SILICON/SIPOS surface in an ultra high vacuum.

In accordance with the present invention, the crystalline semiconductor region is siliconbased. A high bandgap heterojunction can be formed at the SIPOS-Si interface 40. However, it is desirable from a device perspective to form regions of lower chemical potential than silicon, to vary the bulk recombination velocity spatially, and to enhance carrier mobility. In general, the above can be accomplished by selectively incorporating silicongermanium alloys in the epitaxial silicon films. Germanium is a Group IV element similar to silicon with some additional desirable properties. Unfortunately germanium has a 4% lattice mismatch with silicon. This high lattice mismatch causes severe lattice strain and has made difficult the accomplishment of pure silicon-germanium heterojunction devices to date. However, silicon-germanium alloys grown by molecular beam deposition offer excellent opportunities to enhance device performance. There are three silicongermanium alloys of interest: germanium counter doping of silicon, commensurate strained layer $Ge_xSi_{1-x}$ alloys, and incommensurate relaxed $Ge_xSi_{1-x}$ alloys.

Germanium counter doping of silicon employs very low levels of germanium in silicon introduced by techniques similar to dopant inclusion and can be used to modulate mobile carrier transport in enhanced device operations. In chemical vapor deposition of silicon by reduction of a halogenated silicon, germanium can be introduced in controlled quantities by means of pyrolysis of germane dopant gas. In molecular beam depositions, germanium atoms can be ion implanted at low energies or co-evaporated during silicon E-beam evaporation. The germanium atom readily occupies a substitutional site but causes a compressive stress in the alloy film. Hence, by controlling the germanium concentration, a very well controlled compressive strain field can be created. The strain field can be used to locally enhance carrier scattering, mobility lowering, or to locally increase the bulk silicon recombination velocity. Germanium counterdoping can also be employed to reduce dopant strain fields. In general phosphorous is utilized as the normal donor impurity in silicon. Since phosphorous is the Group V element immediately adjacent to silicon in the periodic chart, phosphorous is an excellent substitutional donor impurity for silicon. The prevalent acceptor impurity in silicon is boron, which is a much smaller atom than silicon. The atomic size disparity between silicon and boron induces tensile strain fields in boron doped silicon. Additionally, total electrical activation of the dopants is impeded since boron atoms can easily fit interstitially in the lattice and will remain electrically inactive. This tensile strain field crystal periodicty and degrades free carrier mobility. By employing concurrent boron doping and germanium counterdoping of silicon, the compressive strain field of the germanium atoms can counterbalance the tensile strain field of the boron atoms. Consequently, the silicon can be doped at high acceptor concentrations with control of the strain field by means of germanium concentration. This can easily be accomplished in the molecular beam epitaxial reactor 10 (FIG. 1) with silicon E-beam evaporation and concurrent implantation of boron and germanium using two low energy ion implanters.

Incommensurate relaxed $Ge_xSi_{1-x}$ alloys can be employed to create localized regions of stress induced dislocations, which can be useful for extrinsic gettering of an active region or a localized recombination velocity to quench minority carriers. The alloy is sufficiently germanium rich such that the silicon-germanium lattice mismatch strain causes the alloy to relax by means of a lattice dislocation network. In a $Ge_xSi_{1-x}/Si$ system the relaxation always occurs at the $Si/Ge_xSi_{1-x}$ interface and the degree of the dislocation network is proportional to the germanium concentration, x. The silicon region remains unstressed.

$Si/Ge_xSi_{1-x}$ strained layer epitaxy can be used to produce a modulated chemical potential in a monocrystalline silicon-based semiconductor region by means of molecular beam deposition techniques. It has been suggested that isotype strained layer $Ge_xSi_{1-x}/Si$ superlattice structures may be suitable for heterojunction applications. The strained layers can be produced by coevaporation of silicon and germanium in an ultra high vacuum with simultaneous ion implantation of a dopant species. The superlattice is formed by a repetition of layers of a $Ge_xSi_{1-x}$ alloy clad on silicon. Each alloy film will remain commensurate and strained up to a certain thickness for each value x. Beyond this thickness the strain becomes excessive and the alloy relaxes by means of dislocation formation, by forming an incommensurate layer.

The thickness value for which the alloy relaxes decreases for increasing proportions of germanium. All strain occurs in the $Ge_xSi_{1-x}$ alloy and not in the clad silicon with the dislocation network originating at the interface of the $Ge_xSi_{1-x}$ and clad Si. By repetition of $Ge_xSi_{1-x}$ and Si films, a strained superlattice of approximately 1 micron can be formed with a substantially lower chemical potential than an equivalently doped silicon region with a varying bandgap and an overall increased intrinsic carrier concentration. The ability to bandgap modulate a silicon based region will permit unique device structures.

Consequently, it is possible to grow epitaxial strata of silicon, silicon-germanium alloys, silicon rich oxides, and transition metal silicides. The crystalline ordering of the epitaxial silicon over the dielectrics and silicides is due in part to the crystallinity of the dielectrics and silicides as grown in an ultra high vacuum as well as the enhanced atomic ordering in the lateral direction on a very clean surface in an ultra high vacuum. These crystalline strata can be configured to form high performance transistors as well as three dimensional wafer processing by means of low temperature ($<700°$ C.) beam processing in an ultra high vacuum with maskless operations. Full electrical activation can be achieved by means of rapid thermal annealing. The acitve device region will be comprised of an arbitrary number of epitaxial strata, each of which is comprised of sub-strata epitaxial layers of silicon, silicon-germanium alloys, silicon rich oxides, an silicides.

Figure 3:
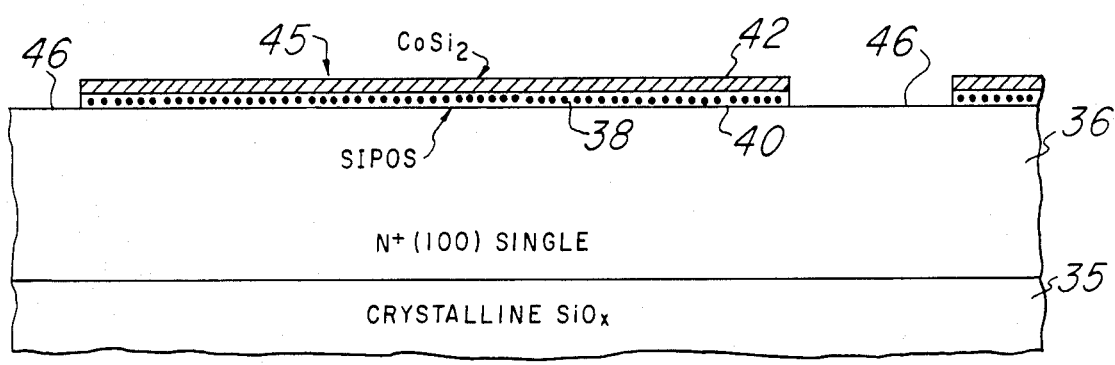
FIG. 3 is a side view of the structure of FIG. 2 having a further layer of $CoSi_2$ thereover, in the fabrication of transistor structures formed in accordance with the invention.

One possible such layer will now be described with reference now to FIG. 3. The strata will be grown over the single crystal silicon substrate 36 of $<100>$ orientation. A single crystal $SiO_x$ film 38 is then grown by molecular beam deposition in an ultra high vacuum. The unannealed crystalline $SiO_x$ film, serves as the primary insulator between epitaxial strata upon subsequent anneal. A transistion metal silicide 42, for example, $CoSi_2$, as shown, is deposited by molecular beam deposition. The single crystal structure of the underlying crystal serves as a buried, lateral conductor. Cobalt silicide is selected since it has a cubic crystalline structure similar to silicon with the lattice constants within 1.5% matching between silicon and cobalt disilicide. $CoSi_2$ has a low formation temperature (450°) and a high melting temperature (1326° C.). The SIPOS-silicide sandwich of layers 38 and 42 is selectively milled by focused or masked ion beam techniques to isolate islands 45 and to expose underlying single crystal in the vias 46. Minimal focused ion beam writing time is required.

Figure 4:
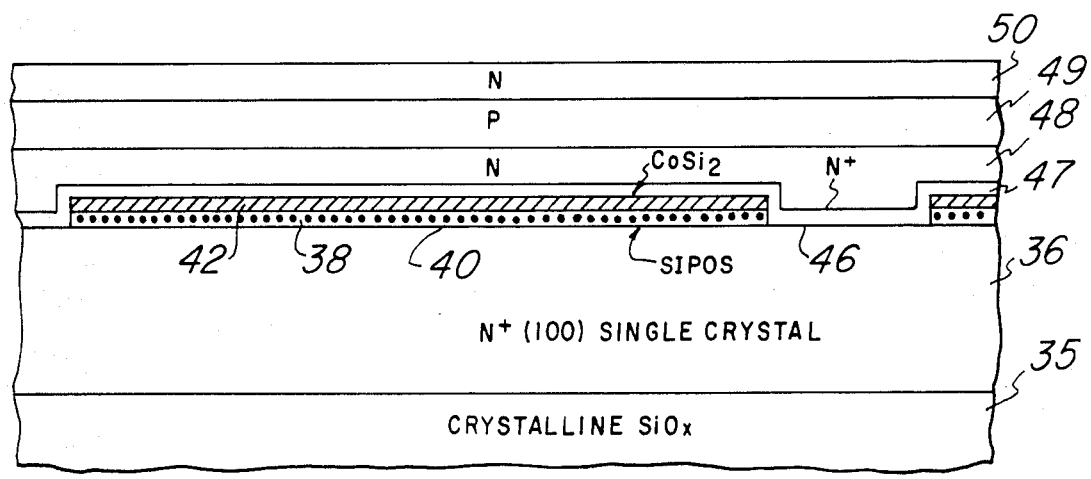
FIG. 4 is a side view of the structure of FIG. 3 having further layers of doped epitaxial silicon thereover, in the fabrication of transistor structures formed in accordance with the invention.
Figure 6:
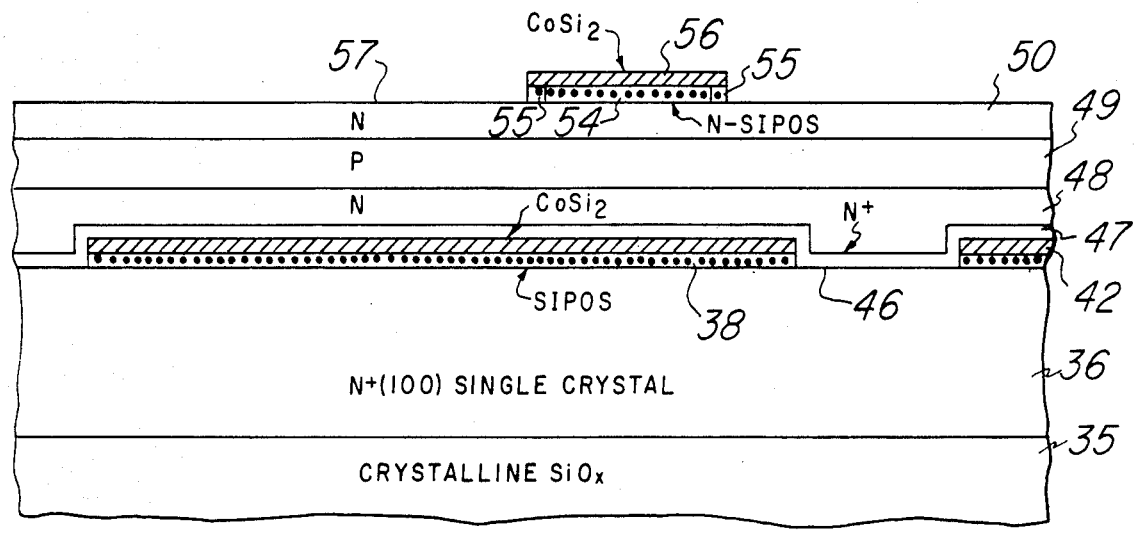
FIG. 6 is a side view of the structure of FIG. 5 having a further layer of $CoSi_2$ thereover the SIPOS and N-SIPOS, in the fabrication of transistor structures formed in accordance with the invention.

As illustrated in FIG. 4, a plurality of epitaxial silicon layers 47–50 are next deposited over the single crystal silicide 42 or the crystalline oxide with the exposed crystalline silicon 36 serving as the primary nucleation site. The impurity concentration levels can be controlled by simultaneous ion implantation doping during molecular beam deposition. Controlled quantities of germanium can be introduced in various locations of the epitaxial layers by shuttering an E-beam evaporated germanium source in the MBE deposition chamber 10. The epitaxial layers order in all directions over the exposed monocrystalline silicon region, and order in the $<100>$ direction rapidly over the crystalline silicide 42 and crystalline oxide, due to the ultra high vacuum. The crystalline order of the oxide and silicide enhances total ordering over the oxide and silicide giving rise to uniform single crystal silicon films 54 and 55 as shown in FIG. 6.

Figure 5:
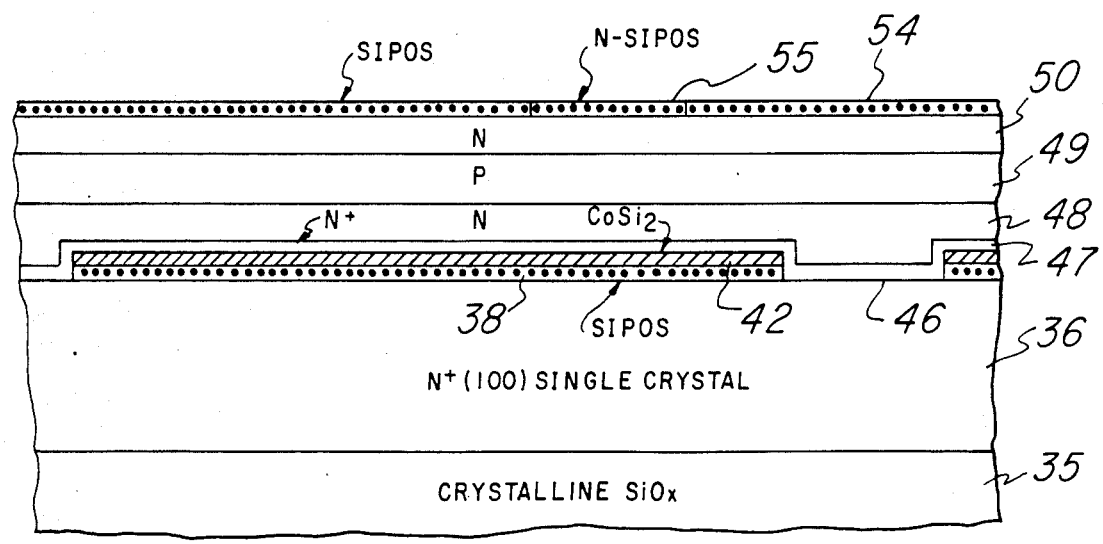
FIG. 5 is a side view of the structure of FIG. 4 having a further layers of SIPOS and N-SIPOS selectively formed thereover, in the fabrication of transistor structures formed in accordance with the invention.

The bottom SIPOS film 38 shown in FIG. 5 could serve as the dielectric separating the collector region of the transistor being formed from the substrate. The overlying cobalt disilicide layer 42 could serve as the collector contact. By controlling the ohmic/Schottky characteristics by means of the N+film 47, the collector boundary recombination velocity can be modulated. The overlying three silicon epitaxial layers 48–50 could serve as the respective collector, base, and emitter regions. The emitter boundary recombination velocity and emitter contact can be realized in a similar manner to the collector. A single crystal SiO$_x$ film is then grown by molecular beam deposition in an ultra high vacuum. The undoped SiO$_x$ film is selectively doped in an ultra high vacuum by focused ion beam techniques. Specific ions (antimony for N type and gallium for P type) are focused in a high energy beam (about 100 KeV) onto the wafer 11 which is accurately positioned with a laser interferometer. In this manner, the SIPOS films 54 and 55 can be selectively doped on a regional basis.

Again a crystalline silicide, such as the CoSi$_2$ layer 56 shown, or NiSi$_2$, is overgrown and the sandwich is milled selectively in an ultra high vacuum to contact the underlying monocrystalline silicon region 57.

Figure 7:
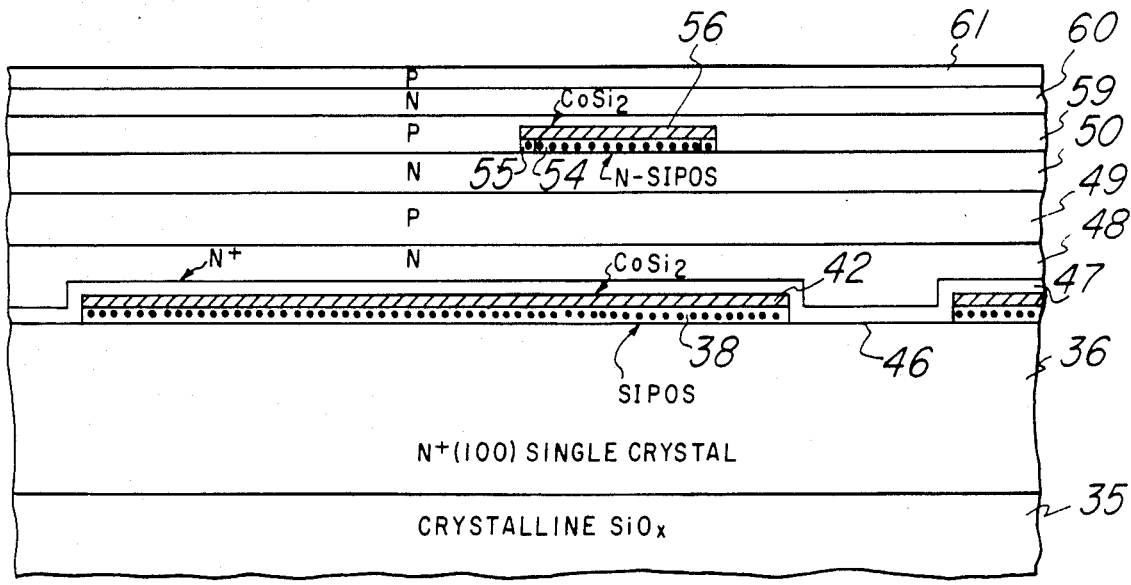
FIG. 7 is a side view of the structure of FIG. 6 showing additional doped epitaxial layers of silicon formed over the $CoSi_2$ and SIPOS layers, in the fabrication of transistor structures formed in accordance with the invention.

Finally, the remaining silicon epitaxial strata 59-61 can be grown in an ultra high vacuum as shown in FIG. 7.

Consequently, a multilayer epitaxial strata can be grown either by conventional chemical vapor deposition or by molecular beam deposition. The epitaxial strata may be either homoepitaxial silicon or heteroepitaxial layers composed of semiconductor alloys (e.g. silicon or germanium), dielectrics, or transition metals and silicides. The precise composition of the epitaxial strata, as well as the fabrication technique, will be determined by the specific circuit application.

Figure 8:
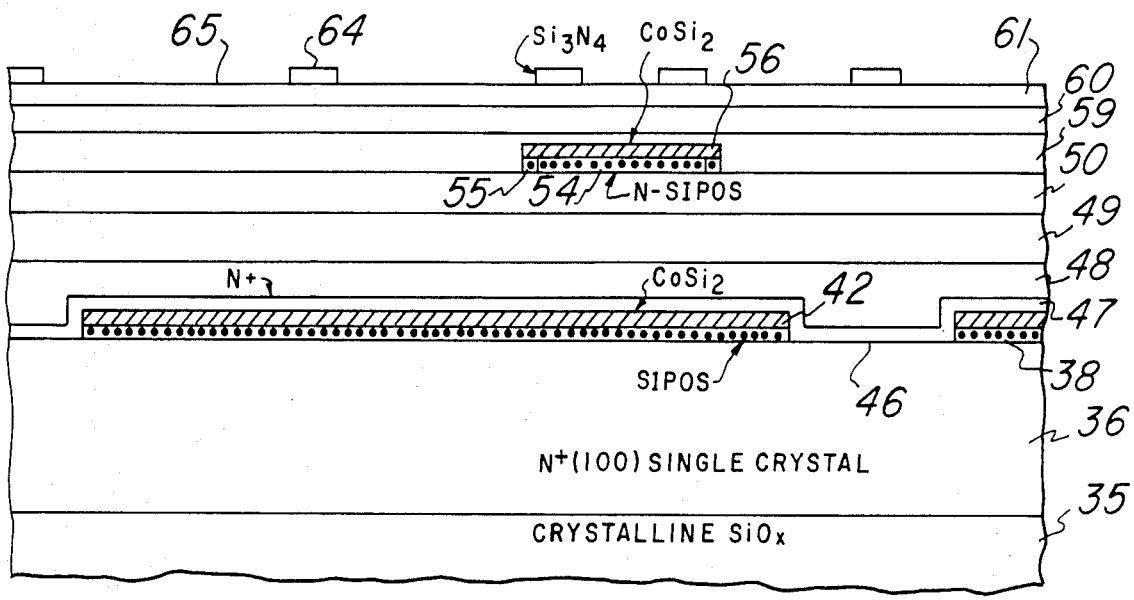
FIG. 8 is a side view of the structure of FIG. 7 showing $Si_3N_4$ contacts patterned thereover, in the fabrication of transistor structures formed in accordance with the invention.

The epitaxial strata was grown carefully in a noncompensated manner in order to preserve crystalline perfection. Component delineation is also performed in such a manner to preserve crystallinity. Anisotropic silicon etching is employed by utilizing either potassium hydroxide or ethelenediamine, both of which have high preferential etch rate in the <100> direction compared to the <111> direction. Although a number of films can be employed as etch masks, a silicon nitride (Si$_3$N$_4$) layer 64 deposited by means of low pressure chemical vapor deposition will serve as etch mask with potassium hydroxide being utilized as the etchant. The Si$_3$N$_4$ layer 64 is overcoated with a patterned photoresist and the Si$_3$N$_4$ is selectively etched and patterned by plasma etching or with a hot phosphoric acid, as shown in FIG. 8.

Figure 10:
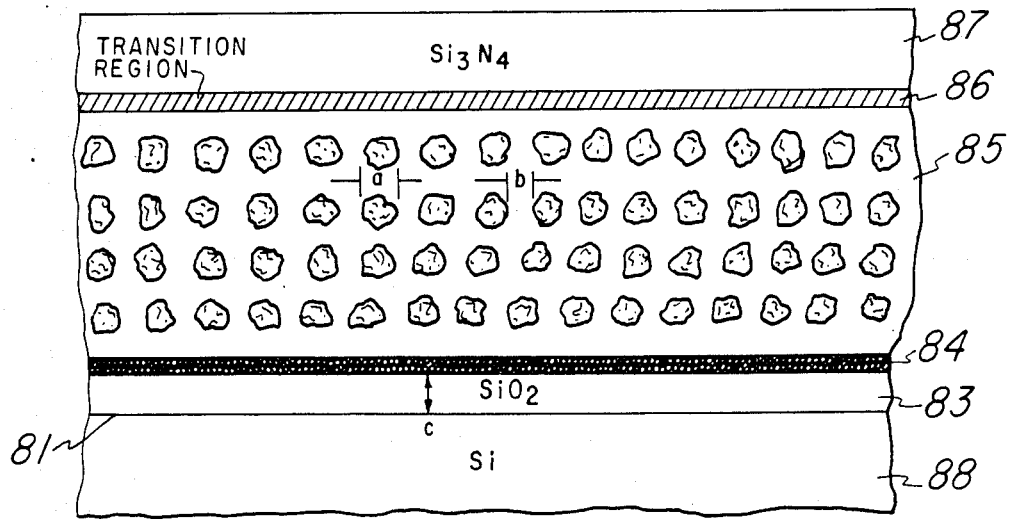
FIG. 10 is a side view of a portion of a silicon structure showing a "SIPONT" film thereover to passivate and hermetically seal the substrate on which it is formed, in the fabrication of transistor structures formed in accordance with the invention.
Figure 9:
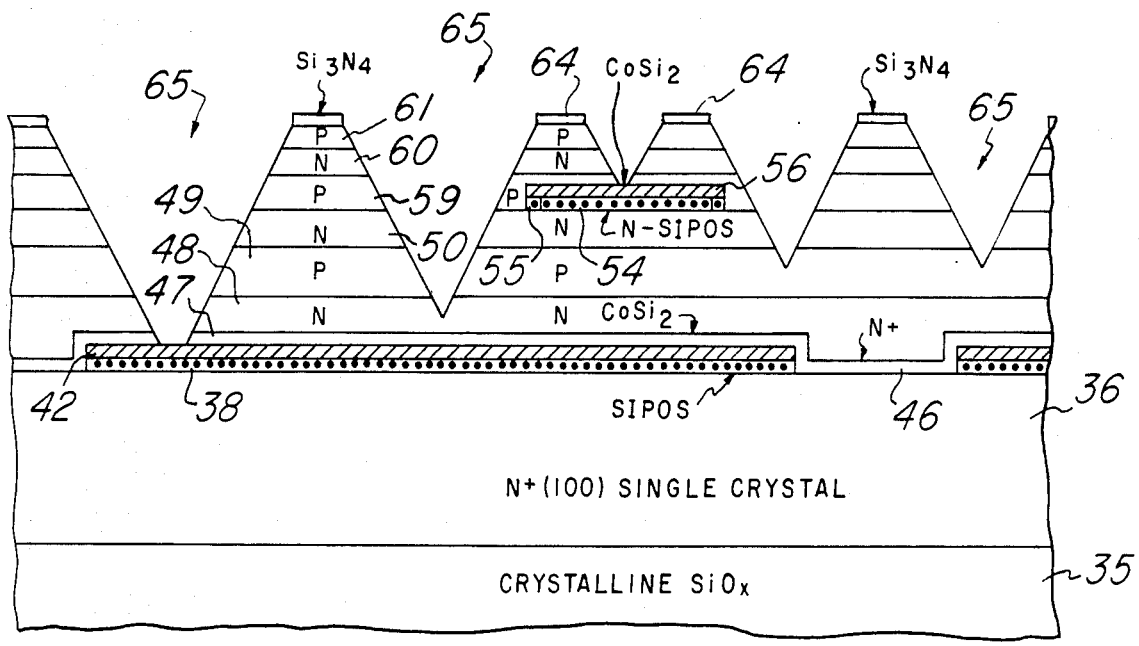
FIG. 9 is a side view of the structure of FIG. 8 showing anisotropic silicon etching of the structure in the fabrication of transistor structures formed in accordance with the invention.

As shown in FIG. 9, the epitaxial strata are etched in the regions 65 exposed by the of patterned Si$_3$N$_4$ by means of heated (85° C.) propanol diluted potassium hydroxide. The etch rate of the <100> silicon is approximately 1 micron/minute while the etch rate of the <100> silicon is 50 times slower. The Si$_3$N$_4$ 64 will etch at less than 100 Å/minute. As a result, etching will proceed along <100> crystallographic planes with virtually no undercutting under the Si$_3$N$_4$ 64. When two <111> planes intersect, silicon etching will essentially cease. Consequently, the depth of the V-Groove can be accurately controlled by means of the aperture of the Si$_3$N$_4$ etch mask an any combination of etch depths can be simultaneously achieved with minimal process control. In this manner, each region of the epitaxial strata can be contacted in a controlled manner while preserving crystalline perfection. FIG. 10 illustrates the delineation concept, but it will be appreciated that this specific delineation may require two successive etch operations, as will be subsequently explained.

The component delineation by means of anisotropic silicon etching exposes the appropriate epitaxial layers to be contacted or connected in a number of methods. Contact may be achieved directly by means of a metal, silicide, or polysilicon. Alternately, contact by a metal may be achieved indirectly to the crystal via a silicide, SIPOS, or diffusion. In addition to direct contact, epitaxial layers may be capacitively contacted by means of a dielectric, for example, silicon dioxide or titanium dioxide, over which a metal, silicide, or polysilicon may be employed as an MOS gate system. Finally, isolation between epitaxial layers may be achieved by means of anisotropic silicon etching and subsequent deposition of a dielectric, e.g. SIPOS or polyimide.

The structure of FIG. 9 is an example of simultaneous isolation and contact to all layers of a heteroepitaxial structure. Regions where isolation or MOS gate fabrication are desired are formed with intersecting <111> planes in silicon. Epitaxial strata contact is indirect via CoSi$_2$ and doped SIPOS. The potassium hydroxide etch rate significantly slows down in the CoSi$_2$/SIPOS sandwich. This approach requires moderate process control, especially when outside corner faceting is considered. The <111> planes intersect the <100> planar surface at 54.7° and are orthogonal to each other. Consequently images on the Si$_3$N$_4$ mask will always appear as rectangles if no outside corners are encountered. Etching will always seek out the <111> planes and self-stop upon intersection of the <111> planes. An outside corner does not expose the <111> plane, and consequently will facet in search of the <111> plane. Faceting will vary with the etchant as slower etching orientations, but not slower then the <111> orientation, are uncovered. Faceting with potassium hydroxide will tend to occur along the <331> plane, which is 26° oblique to the <111> plane; faceting with ethelenediamine will tend to occur along the <221> plane, which is 20° oblique to the <111> plane. The rate of faceting is heavily influenced by the etchant temperature. Furthermore the degree of faceting will depend on time exposed to the etchant. Faceting will continue after the V-grooves have bottomed out.

There are several methods available to avoid disastrous geometric destruction due to faceting. One method, is to construct all geometries by means of segments containing only inside corners. This is most effective and totally desensitizes geometries from process control. It is effective for geometric contact to any epitaxial layer but not for isolating a strata region since isolation needs to be inclusive, and therefore, will contain outside corners. A method of limiting faceting is known as corner compensation. The Si$_3$N$_4$ etch mask is patterned on the outside corner such that it will result in a square outside corner due to a predetermined etch process. The exact dimensions of the corner compensation are dependent upon the etch time as well as localized exothermic heating effects. Consequently, it is sometimes necessary to separate various delineation etches in a sequential manner.

There are several methods of component delineation in the three dimensional epitaxial strata, all of which involve silicon etches (anisotropic etch is preferred). There are three different silicon etches required for component delineation which may be done separately or concurrently. One anisotropic silicon etch is required to contact all acceptor doped regions with the depth of each contact etch controlled by the width of the patterned aperture of the silicon nitride on the planar surface. Since the P contact etch can be segmented, there is no need for corner compensation and corner faceting is not a problem. Similarly, an anisotropic silicon etch is utilized to contact all donor doped regions. The third silicon etch is employed to form mesa isolation or MOS gate regions, and as such, may not be suitable for segmentation. consequently, precautions against faceting may be warranted, for example, corner compensation and etch control.

As previously stated, the three etches may be performed concurrently or sequentially. If a diffusion is employed, which is most undesirable with respect to lattice damage, then the etches should be sequential. On the other hand, if a doped semi-insulating film is utilized, then the etches can be concurrent, which is preferred for process simplification. However, in order to minimize focused ion beam patterning of silicide-SIPOS films in heteroepitaxial strata, it is advisable to separate the mesa anisotropic etch from the contact anisotropic etches. The primary purpose of the mesa is for isolation, and hence, mesa etches generally bottom out with full intersection of the <111> planes. Contact anisotropic etches are designed to stop in the silicide-SIPOS sandwich, and therefore, full intersection of the <111> planes is undesirable. Consequently, mesa and contact anisotropic etches should be performed sequentially with different etch rate control.

It is, in general, desirable to only pattern the silicide-SIPOS sandwich with focused ion beams in regions mandating an absence of silicide-SIPOS for proper transistor operation as well as in regions to ensure sufficient exposure of underlying monocrystalline silicon to enhance epitaxial nucleation over the silicide-SIPOS film. This mandates that the mesa anisotropic etch is capable of etching the silicide-SIPOS film in addition to the silicon regions. Although the silicide-SIPOS is ordered similar to the monocrystalline silicon, the etch rate in the silicide-SIPOS film will be reduced over that of monocrystalline silicon, primarily due to the presence of oxygen. The propanol-potassium hydroxide solution can be enhanced and the etch times can be adjusted for the mesa etch. The corner compensation can be adjusted by photomask design as previously discussed. The silicon nitride anisotropic etch mask can easily withstand the modified etch process.

After mesa anisotropic etch, the wafer can be subjected to rapid thermal annealing using halogen lamps or other tecniques. Typically the anneal is done at 1200° C. for 10-20 seconds. This does not cause a diffusion of silicon or germanium and the cobalt disilicide can withstand this temperature. However the SIPOS films undergo significant internal restructuring as will be discussed in more detail later. The oxygen segregates out of the grains, which grow in size, and the intergranular oxide densifies and tends towards $SiO_2$. Consequently, the SIPOS films loose the monocrystalline nature and become virtually immune to potassium hydroxide etching due to the silicon dioxide densification; and hence, the annealed SIPOS film provides an excellent etch stop mechanism for KOH etch. The contact anisotropic etches are therefore performed in propanol diluted potassium hydroxide after SIPOS densification. Note that the mesa anisotropic etch did not etch any $CoSi_2$/SIPOS as shown in FIG. 10 due to a prior patterning by focused ion beam. The mesa anisotropic etch in general can etch the $COSi_2$/SIPOS layer. If the process is performed such that the $CoSi_2$/SIPOS is totally patterned by focused or masked ion beam techniques, then the mesa and contact anisotropic etches can be combined into one etch.

A unique doped semi-insulating film, hereafter referred to as "SIPONT" (P-"SIPONT" for acceptor doped "SIPONT", N-"SIPONT" for donor doped "SIPONT", and "SIPONT" for undoped film), is utilized to contact all monocrystalline regions, and to passivate the monocrystalline. In the fabrication of a "SIPONT" film, with reference now to FIG. 10, prior to deposition, the wafer 80 is stripped of all oxides and nitrides, thereby exposing only the silicon surface 81. The wafer 80 is cleaned with any one of several clean-ups, for instance, cholene or RCA ($H_2SO_4$:$NH_4F$, $NH_4F$:$NH_4OH$, $HCl$:$H_2O_2$, $H_2O$). These clean-ups leave a very thin chemical oxide (not shown) which is removed by a dilute hydrofluoric acid deglaze. The wafers are then loaded into a low pressure chemical vapor deposition (LPCVD) reactor, in which the "SIPONT" films are grown. The doped "SIPONT" film is actually a composite structure comprised of interfacial oxide 83, amorphous doped silicon 84 (and/or amorphous germanium), doped SIPOS 85, silicon rich oxynitride 86, and silicon nitride 87 in ascending order from the silicon surface as shown in FIG. 10.

The purpose of the doped "SIPONT" is to transmit majority carriers to the selected monocrystalline region and to simultaneously provide a controllable recombination velocity at the termination of the monocrystalline region for minority carriers in the monocrystalline region. The contact to the monocrystalline region is done so as not to perturb the precise periodic structure of the monocrystalline region while controlling the surface recombination velocity. Processing occurs at low temperatures (<700° C.) in order to avoid smearing the abrupt junctions formed in the underlying active regions. An interfacial oxide will lower the surface recombination velocity and will reduce the transmission of majority carriers into monocrystalline region. Although in some applications this may be desirable, in most it is not. Moreover, the quality of the native or chemical oxide is inferior to a thermal oxide and may undergo deleterious changes in device operation. Consequently, the wafers are unsually exposed to a high temperature reducing ambient after insertion into the LPCVD to reduce any native oxide. One possible "SIPONT" structure and deposition sequence is described below.

An amorphous silicon layer (100–200 Å) 84 is employed to set the surface recombination velocity in concert with subsequent halogen lamp anneal. The amorphous silicon 84 is formed by the pyrolysis of silane ($SiH_4$) with nitrogen as the carrier gas. The grain structure of the deposited film is very sensitive to the growth temperature. Below 580° C. the grains are less than 10 Å and the films are amorphous. Above 600° C. the grains get larger with increasing growth temperature and the films are polycrystalline in nature. The smaller grains grow much larger with improved order upon subsequent annealing by means of halogen lamps where the large polycrystalline grains exhibit minimal grain growth upon anneal. The residual stresses of the various grain structures are very different. Moreover, the solid solubility of oxygen into the grains or the precipitation of oxygen out of the grains are dependent on the as-deposited grain structure and the subsequent annealing. Consequently, the final interface between the "SIPONT" and the monocrystalline silicon 88 is heavily dependent upon interfacial oxide, stress, and bond structures (fixed charge density) which are affected by the as-deposited grain structure and subsequent annealing. The recombination velocity can be further enhanced by simultaneous pyrolysis of germane resulting in a composite amorphous silicon/amorphous germanium film with higher stresses.

After setting the desired surface recombination velocity and barrier oxide by the very thin amorphous silicon layer 84, a layer of doped SIPOS 85 is grown over the amorphous silicon layer 84 in-situ in the LPCVD reactor. The doped SIPOS layer 85 is typically 2000 Å in thickness and may be doped N or P type by selecting the dopant species. The doped SIPOS is formed by reacting silane and nitrous oxide in the presence of a dopant gas with nitrogen or argon serving as the carrier gas. Diborane is a typical acceptor dopant gas and phosphine is a typical donor dopant gas. The nitrous oxide provides the oxygen for the silicon rich oxide film. By controlling the relative flow rates of the silane and nitrous oxide, the relative oxygen concentration of the film 85 can be controlled. The grain structure and the intergranular oxide structure are both heavily dependent upon the deposition conditions and subsequent annealing. The inclusion of oxygen tends to cause the as-deposited grains to be smaller, and consequently the deposition temperature of the SIPOS layer 85 is raised to 620° C.–650° C. The dopant gas dopes the intergranular oxide. Since the interface traps deplete the polycrystalline grains, mobile carrier transport is controlled by the intergranular oxide. Consequently, both the oxygen concentration and the oxide dopant concentration heavily influence mobile carrier transport through the film 85.

Upon completion of the doped SIPOS film 85, the dopant gas is turned off and ammonia is turned on concurrently with silane and nitrous oxide. This action forms a thin transition region of silicon rich oxynitride. Shortly thereafter the temperature is raised to 810° C. and after thermal settling the nitrous oxide is turned off to enhance deposition of pure silicon nitride. Approximately 1200 Å of $Si_3N_4$ 87 is deposited by reacting silane and ammonia with a transition region 86 of silicon rich oxynitride between the silicon nitride 87 and the SIPOS 85. The nitride 87 serves to seal the underlying film and interface from oxygen and moisture as well as a protective mask for subsequent etches. The oxynitride 86 relieves stress and protects the boundary recombination velocity from piezolelectric effects.

Figure 11:
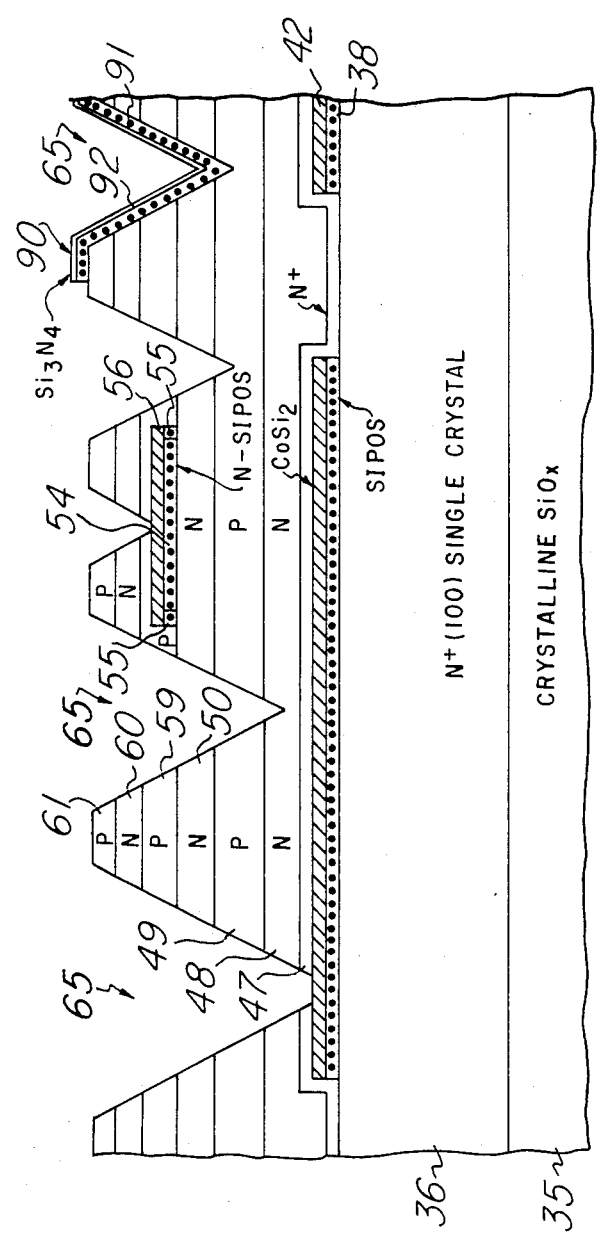
FIG. 11 is a side view of a structure of FIG. 9, showing deposition and etch of P-"SIPONT" in the fabrication of transistor structures formed in accordance with the invention.

The doped "SIPONT" is etched by means of a two step technique. The nitride 87 and transition region 86 are etched by $CF_4$ plasma etch masked by photoresist. The plasma etch is significantly retarded in the SIPOS. The SIPOS 85 is then etched by means of a wet etch comprised of $NH_4F:HF:H_2O_2$, which is masked by photoresist (or $Si_3N_4$ where the photoresist has broken down). After etching, the photoresist is removed and the wafer is cleaned in preparation for the next "SIPONT" deposition. In this manner the wafer is first coated with a P type "SIPONT" and the "SIPONT" is removed in all regions except where a P contact to the monocrystalline region is desired. FIG. 11 illustrates a wafer after "P-SIPONT" layer 90 has been deposited and etched (the layer 90 being abbreviatedly shown as a layer 91 of P-type SIPOS and an overlying layer of $Si_3N_4$ 92).

After the deposition and etch of the "P-SIPONT", the process is repeated but with a phosphine dopant gas to contact the N type regions. Similar to before, the "N-SIPONT" (not shown) is removed by two step etch process in all areas except where contact to an N type monocrystalline region is desired. The silicon nitride layer 92 on top of the P-SIPOS 91 protects the "P-SIPONT" film 90 from oxygen contamination during "N-SIPONT" deposition. Moreover, the silicon nitride layer 92 protects the "P-SIPONT" film 90 during "N-SIPONT" etch. Specifically, the wet etch portion of the two step "N-SIPONT" etch will stop at the silicon nitride cap of the "P-SIPONT" 90. After the "N-SIPONT" etch, the photoresist is removed and the wafer is cleaned.

Figure 12:
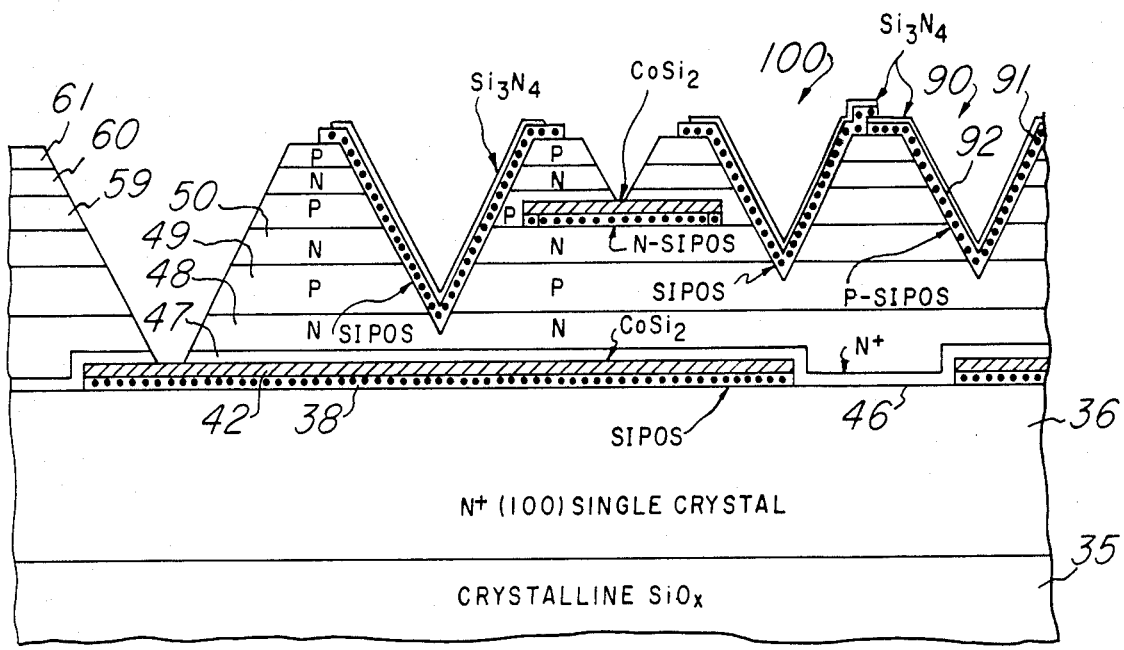
FIG. 12 is a side view of a structure of FIG. 11, showing deposition and etch of undoped-"SIPONT" in the fabrication of transistor structures formed in accordance with the invention.

Finally the wafer is coated with an undoped "SIPONT" 100 which will passivate the monocrystalline wafer in all areas except where metal contact is desired, either directly or capacitively via a dielectric. In general, it is desirable that the undoped "SIPONT" 100 have a high surface recombination velocity to preclude formation of undesirable inversion channels. The undoped "SIPONT" 100 is patterned and removed from only those regions requiring metal contact to the active region (directly or capacitively). The silicon nitride caps 92 on the P-"SIPONT" 90 and N-"SIPONT" films again protect the contact films from the undoped "SIPONT" etch, as illustrated in FIG. 12.

Finally a rapid thermal anneal is performed using halogen lamps to electrically activate the dopants, segregate the oxygen, grow the grains to the proper size, anneal damage, and set the final recombination velocity. Since the lamp anneal is done for very short duration, typically 10–20 seconds, no perturbation of the underlying active regions occurs. The lamp anneal completes delineation/passivation of the wafers. However, wafers containing any MOS or capacitive components still require the growth of a dielectric.

Figure 13:
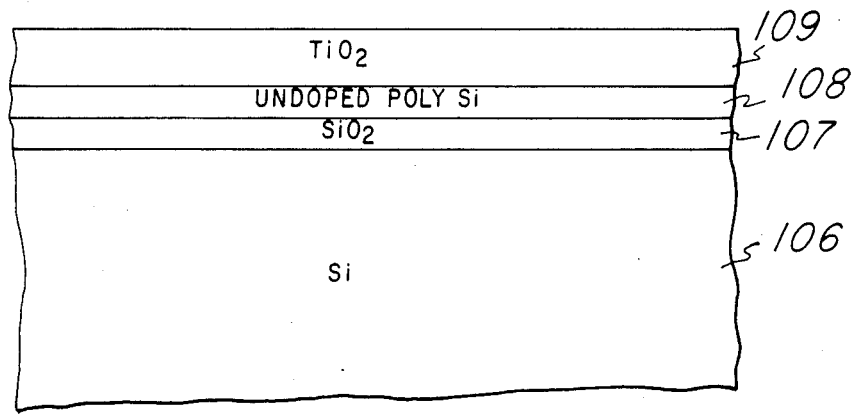
FIG. 13 is a side view of a semiconductor structure showing the formation of a dual dielectric gate thereupon, in the fabrication of transistor structures formed in accordance with the invention.

Although many gate systems could be employed, this present invention employs a dual dielectric metal gate system, the construction of which is illustrated with reference to FIG. 13. In order to enhance the gate dielectric permitivity, $TiO_2$ is utilized. However, $TiO_2$ has a low breakdown voltage, consequently, a layer having a lower specific capacitance, $SiO_2$, is grown under the $TiO_2$ to support the voltage. The dual dielectric system is fabricated such that the $SiO_2$ is protected from pinholes and contaminants by the $TiO_2$. Thus, the wafer 106 is cleaned and the thin $SiO_2$ layer 107 is grown by one of several techniques: thermal oxidation (wet or dry), CVD oxidation, or flash oxidation with halogen lamps (wet or dry). The temperature and duration of oxidation are dictated by the oxidation technique, but in any event, are controlled so as not to degrade the underlying active regions. The halogen lamp flash oxidation is preferred so as to minimize restructuring of underlying active regions. The "SIPONT" regions are all totally protected from oxidation effects by means of the silicon nitride cap mentioned above. Typically oxide thickness is 100–300 Å. Subsequent to silicon oxidation, a thin (typically 200–1000 Å) layer of undoped, amorphous silicon 108 is deposited over the silicon dioxide 107 by LPCVD techniques prior to evaporation of electronic grade titanium over the wafer with a thickness of typically 500 Å. After patterning with photoresist, the $TiO_2$ layer 109 is etched with high selectivity over the silicon dioxide-typical etchant is 90% $H_2O_2$:10% HF. This action results in a high etch rate of titanium 109 without creating pinholes in the $SiO_2$ 107, although pinholes may exist in the titanium 109.

The titanium layer 109 is then oxidized at 450° C. for approximately two hours in dry oxygen to form $TiO_2$. The $TiO_2$ layer 109 is approximately three times in volume as compared to the original titanium film. This volumetric expansion during titanium oxidation tends to seal any pinholes that may have existed in the etched titanium film (no pinholes existed in the underlying SiO$_2$). The thin undoped amorphous or polycrystalline silicon film 109 serves several purposes. First of all, the amorphous silicon film 108 precludes reduction of underlying SiO$_2$ 107 during titanium oxidation which avoids problem of decorating SiO$_2$ pinholes. The thin amorphous silicon film 108 also limits current transport through the dielectric, and thereby minimizes subsequent electrical pinhole formation. Upon oxidation, the TiO$_2$ film 108 is virtually immune to any form of etching and hence totally seals the gate oxide system from subsequent processing. Consequently, the entire wafer is subjected to a buffered hydrofluoric acid dip etch to remove all SiO$_2$ 107 except under the TiO$_2$ 109—the wet etch does not penetrate the TiO$_2$ 109 or the Si$_3$N$_4$ which caps all "SIPONT" films. Thus the entire exposed wafer surface is comprised of TiO$_2$ or Si$_3$N$_4$. The TiO$_2$ film 109 has a permitivity that is twenty times greater than SiO$_2$, and consequently, the TiO$_2$ has a very high specific capacitance and is electrically invisible, compared to the SiO$_2$. Consequently, the SiO$_2$ solely determines the MOS electrical performance while the TiO$_2$ is very resistive to etching and provides protection of the thin SiO$_2$. The dual dielectric gate system of SiO$_2$/TiO$_2$ tends to form a high capacitance gate with minimum gate oxide degradation. An alternate duel dielectric gate system (not shown) could simply be a silicon dioxide/undoped polysilicon/metal. The thin silicon dioxide is immediately overlaid with a film of undoped polycrystalline silicon and a metal, such as titanium nitride. The entire sandwich is patterned with one photoresist operation.

Figure 14:
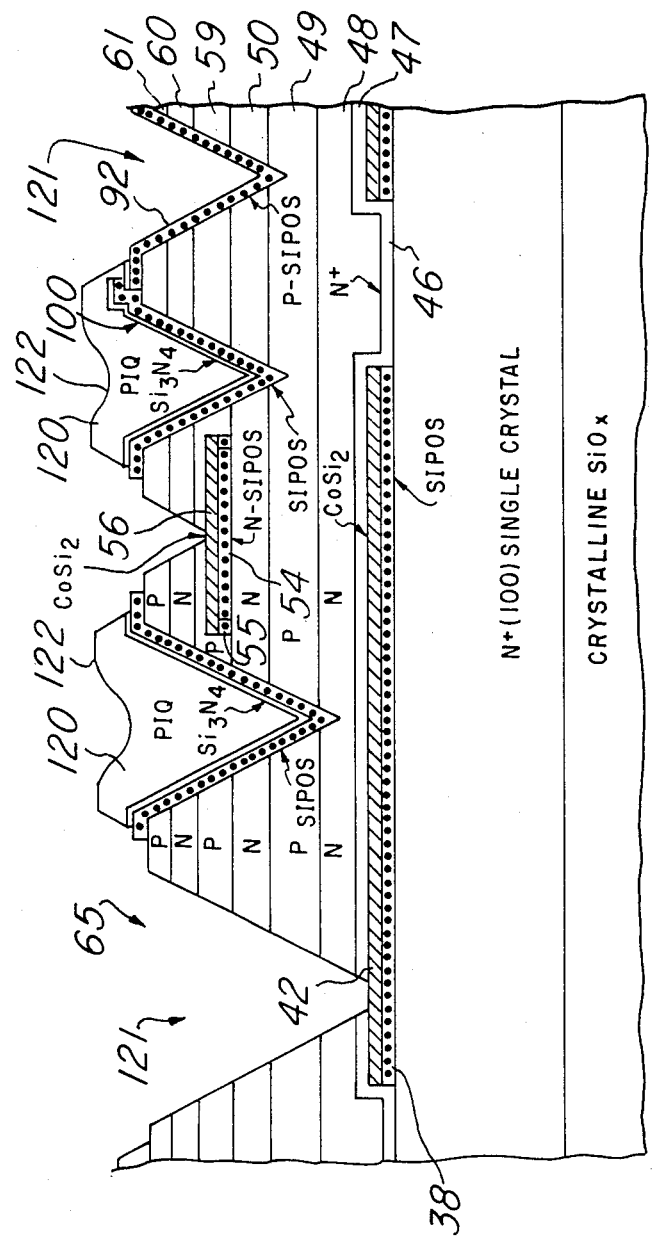
FIG. 14 is a side view of the structure of FIG. 12, showing the deposition of bulk dielectric thereover, in the fabrication of transistor structures formed in accordance with the invention.

With reference now to FIG. 14, after gate dielectric patterning, the non-planar wafer surface is passivated and planarized with an organic film 120. It should be noted that the intitial aluminum metallization will be contact with TiO$_2$ or SIPOS and not phosphorous doped SiO$_2$. There is no silox reflow; contouring is achieved by spinning a polyamic acid. This virtually eliminates lead corrosion due to phosphoric acid. The polyamic acid, such as polyamic acid sold by Hitachi under the trademark "Hitachi PIQ-13", may be spun-on sprayed-on. To enhance adhesion to the wafer surface, and adhesion promoter (not shown), for instance, aluminum chelate, may be applied prior to the polyamic acid. The polyamic acid 120 virtually planarizes the wafer surface prior to metallization. While in polyamic acid form, the organic film may be patterned and etched with a wet etchant like propanol diluted tetramethyl ammonium hydroxide or a dry plasma etch. The vias 121 in the film may be sloped by partially imidizing the film 120 with a pre-etch bake, for example, at about 130° C. for 1 hour in nitrogen. After etching, the polyamic acid is converted to a polymide with a 210° C. solvent bake. The photoresist is removed with an organic solvent and the polyimide is fully imidized with a 350° C./450° C. bake. After full imidization, the polyimide film 120 resists etching from hydrofluoric acid. Consequently, the vias are cleansed of thin oxide layers and outgassing solvents by means of a plasma etch and a light hydrofluoric acid dip etch. The polyimide surface 122 is roughed up prior to metallization by means of a plasma etch in order to promote adhesion on the metal. The wafer after initial polyimide film is applied and patterned as shown in FIG. 14.

Figure 15:
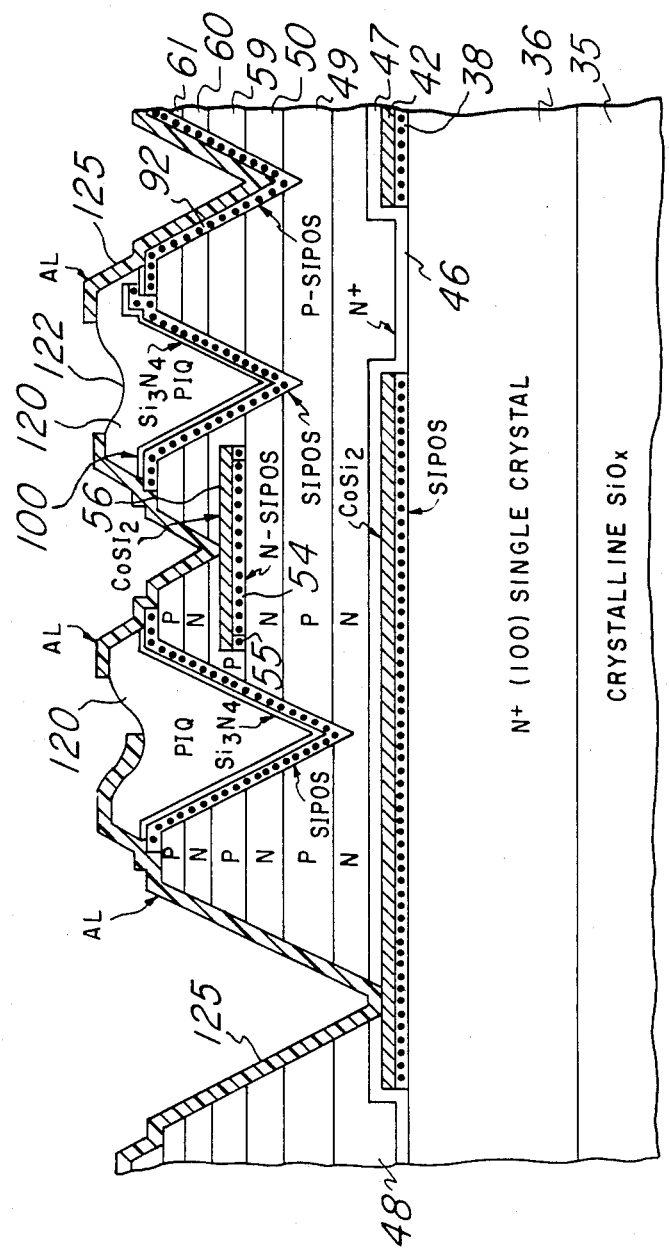
FIG. 15 is a side view of the structure of FIG. 14, showing the patterned partial deposition of metal thereover, in the fabrication of transistor structures formed in accordance with the invention.

An aluminum layer 125 is next evaporated or sputtered over the wafer surface and patterned as shown in FIG. 15.

Figure 16:
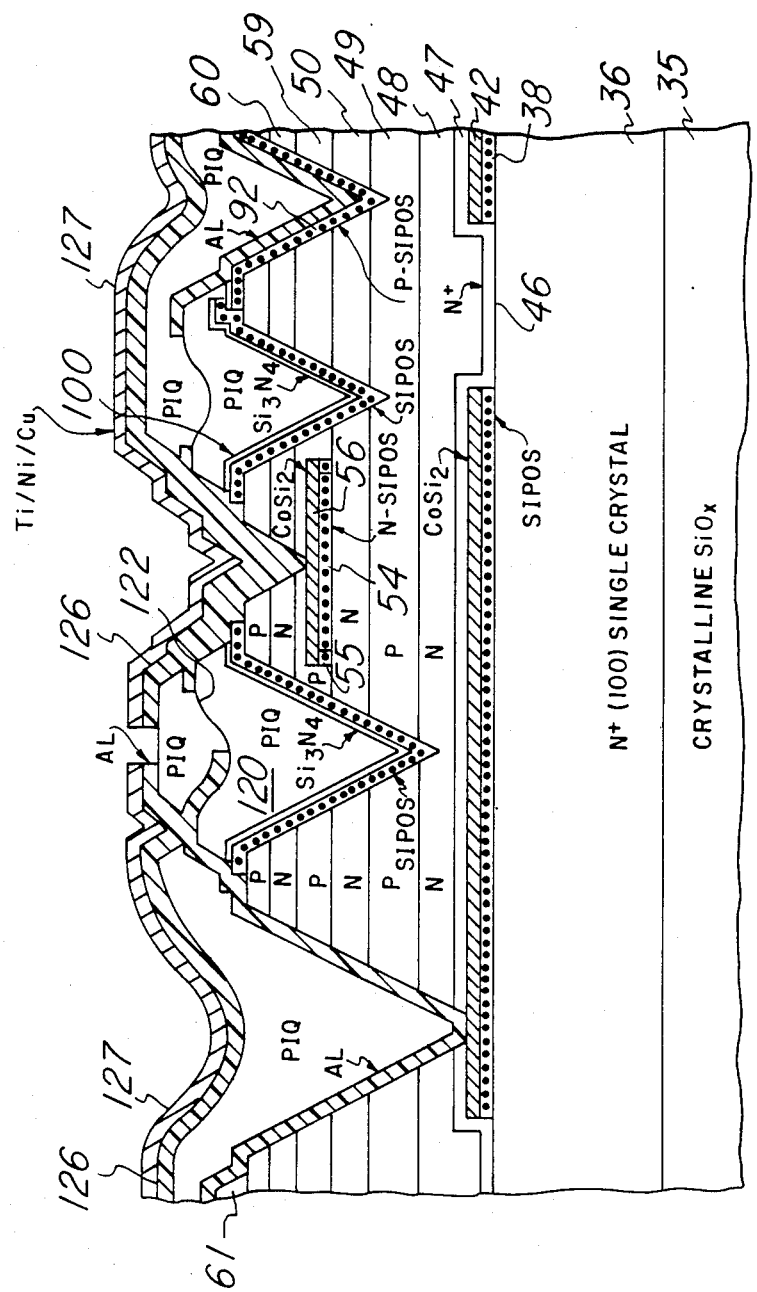
FIG. 16 is a side view of the structure of FIG. 15, showing the completion of the metallization layers thereover, in the fabrication of transistor structures formed in accordance with the invention.

As shown in FIG. 16, multiple levels of metal 126 can be easily implemented by successive, alternating layers of polyimide and aluminum in a manner similar to the initial layers 125. Aluminum and polyimide are extremely compatible since the temperature coefficients are similar and polyimide adheres will to aluminum oxides. The last level of aluminum is topped with a multimetal strata 127 of titanium, nickel, and copper with intermetallic transistions. This multimetal system 127 can be easily deposited by means of a two gun, four target evaporator which allows simultaneous E-beam evaporation of two metals and the sequencing of individual metals, up to a minimum of eight. The aluminum 126 is evaporated first and is followed by pure titanium evaporation. Similarly, the nickel is phased in with the titanium to form an intermetallic followed by pure nickel evaporation. The titanium-nickel intermetallic transition is critical. Finally the copper is phased-in and pure copper is deposited. The aluminum-titanium transition and the nickel-copper transition can be abrupt. A typical multimetal film is comprised of 1000 Å titanium/1000 Å titanium-nickel/2500 Å nickel/4000 Å copper. The aluminum-titanium-nickel-copper sandwich can be easily patterned with a single photoresist, three stage wet etch process. The copper is etched with dilute nitric acid, HNO$_3$(40%):H$_2$O(60%), for approximately 15 sec; the titanium and nickel are etched with a hydrogen peroxide solution, H$_2$O$_2$(5%):HF(5%):H$_2$O(90%), for 45 sec; and the aluminum is etched with a phosphoric acid solution, H$_3$PO$_4$(76%):HNO$_3$(3%):COOH(15%):H$_2$O(5%), for approximately 5 minutes.

The titanium is present to promote multimetal adhesion to the aluminum. The nickel is present primarily to promote a solder wetting base. The copper is present to prevent oxidation of the nickel prior to solder plating; the copper oxide is readily reduced during solder plating. Since the tin leaches the copper into solution and exposed the nickel wetting base. Of course, copper bumps can also be plated onto the copper surface. The multimetal sandwich 126 also provides a passivation against penetration of ions and moisture for the underlying active area. The wafer may, or may not, be lapped and the multimetal sandwich is evaporated onto the backside of the wafer (not shown). The wafer is passivated with polyimide with the bond pads exposed. An aluminum oxide may be utilized to promote polyimide adhesion as well as providing moisture impedance. The aluminum oxide can be formed by spinning on aluminum chelate and evaporating the solvent in an oxidizing ambient. The wafer after all metallization is shown in FIG. 16. Finally the wafer is solder plated front and back in preparation for assembly.

It will be appreciated that the following wafer processing advantages result from the practice of the invention. All active device processing is performed at relatively low temperatures (<700° C.) in an ultra high vacuum by molecular beam deposition. The ultra high vacuum is inherently clean and thereby deleterious particulates can be controlled without a clean room and without direct contact from people, a major source of particles. The low temperature beam processing environment enhances proper atomic structuring of the lattice without thermal diffusion due to the low diffusivities at the growth temperature. The beam fluxes can be controlled accurately in a closed-loop manner, and shuttered for abrupt layer transistions. The beam processing techniques are tailored to produce films of much superior uniformity than conventional wafer processing. Films can be grown with 1% uniformity, which allows integration of components and circuits not heretofore possible strictly due to film variation.

The low temperature desposition reduces thermal stress effects that can alter the crystalline periodicity. The process involves no diffusion, and consequently, reduces the device error introduced by diffusion dependent process parameters. All oxidations are eliminated, thereby further reducing stress and crystal damage. Low temperature beam processing is compatible with large diameter wafer processing. Employing low energy, high current ion implantation as dopant introduction technique permits well controlled doping levels up to 1022 atoms/cm$^3$. Good deposition rates can also be achieved, approximately 50 Å/sec.

Figure 17:
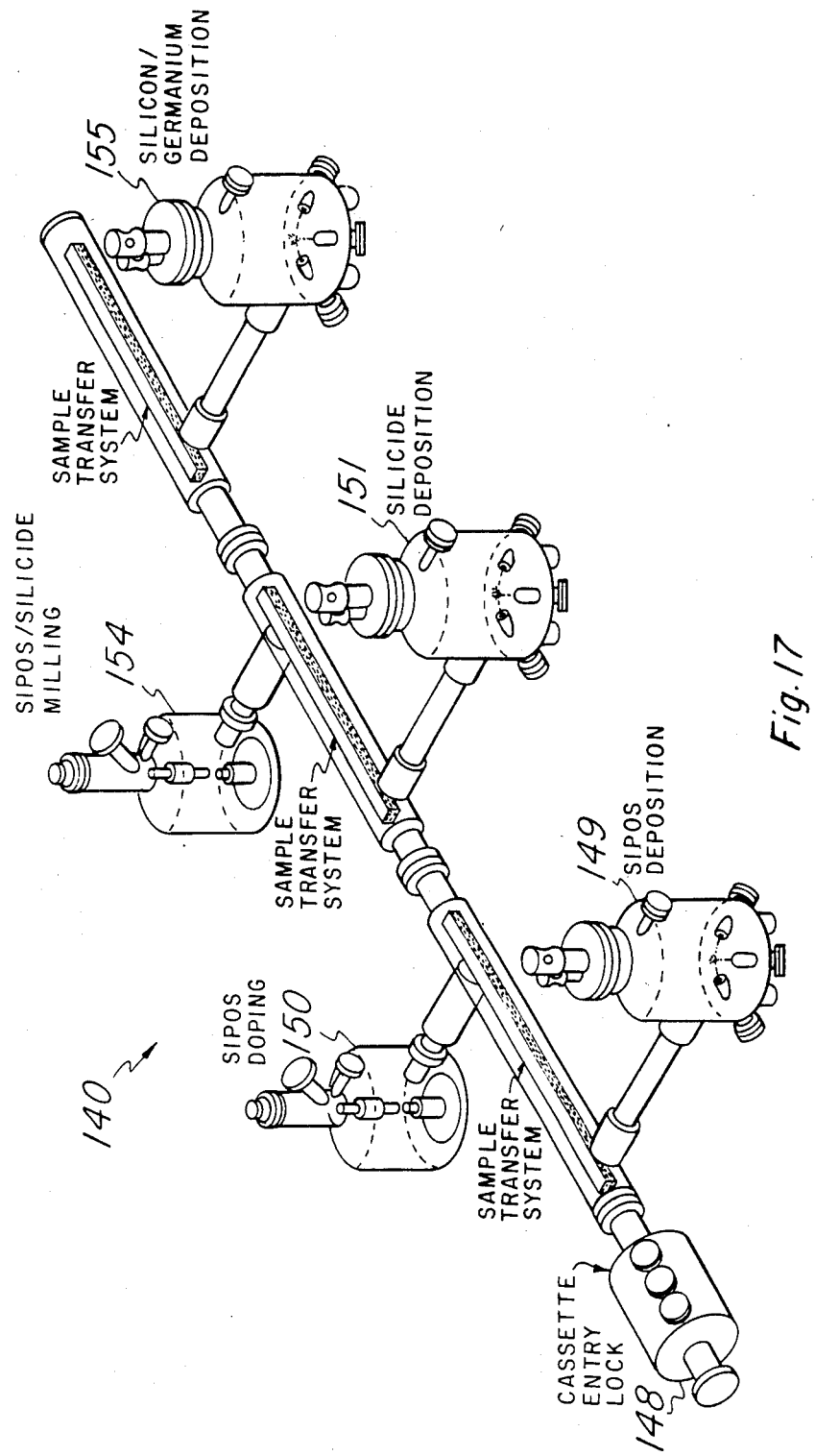
FIG. 17 is a perspective view of a system for making transistor structures, in accordance with the invention.

By integrating a UHV system of reactors, such as molecular beam epitaxial reactor, focused ion beam lithography, UHV chemical vapor deposition, and UHV halogen lamp anneal, then the entire epitaxial strata can be fabricated in-situ in an ultra high vacuum with a maskless, computer controlled process. The focused ion beam (FIB) can be accurately positioned by a laser interferometer for patterns with a resolution down to 500 Å. The FIB can be used for two different applications: selective doping or ion milling. In selective doping acceptor (e.g. gallium) or donor (e.g. antimony) ions can be selectively implanted with high energy beams, typically 100 KEV. In general, selective doping is restricted to non-crystalline regions such as selective SIPOS doping, but selective doping of monocrystalline regions is also available. Ion milling, wither focused or masked, is employed to pattern the silicide and dielectric films by milling through the film to the underlying silicon monocrystal in a selective manner. Writing time is minimized by a minimal use of wide beam milling of the silicide-SIPOS structure. Ion milling could be altogether eliminated to converse writing time by growing all films with total vertical crystallinity (no lateral nucleation) and subsequent anisotropic etching. In this case, only selective doping of thin semi-insulating films is required to contact underlying monocrystalline regions. Some writing or milling can actually be performed by cluster or masked ion beam technology in an ultra high vacuumn. Discretionary 500 Å patterning is available for fine line geometries at the expense of increased writing time. The UHV CVD is utilized for anneals and limited film deposition while the halogen lamp system is used for rapid thermal annealing outside the UHV system. The various reactors can be connected by an ultra high vacuum wafer track which transfers platens or wafers up to 24 inch diameter between individual reactors. Distributed vacuum pumping can maintain the appropriate vacuum level at each point of the processing system. A representative system 140 to fabricate one epitaxial region described in the previous process flow is illustrated in FIG. 17.

The wafer enters via the cassette entry lock 148 and is loaded onto a platen (not shown), pumped down to the appropriate vacuum level, and cleaned. The vacuum processing is designed to have concurrent reactions in each reactor with inter-reactor platen transfer upon completion of each reaction cycle. At appropriate points in-situ analysis equipment (not shown) is located. With respect to the system illustrated in FIG. 18, a crystalline SIPOS film is deposited in the first MBE reactor 140. The crystallinity can be evaluated in-situ with a Rheed diffraction pattern. The SIPOS film is selectively doped in a chamber 150 with antimony in the contract regions by means of focused ion beams in the first FIB reactor. In the second MBE reactor 151, the crystalline cobalt disilicide film is evaporated and evaluated by an in-situ Rheed diffraction pattern. The silicide-SIPOS film is patterned by focused ion beam milling, chamber 154, in the second optional FIB reactor 151. In the third MBE reactor 155 the silicon epitaxial film is deposited with germanium alloys by means of E-beam evaporation or ion implantation and dopant introduction by ion implantation. An in-situ anneal may or may not be included.

Figure 18:
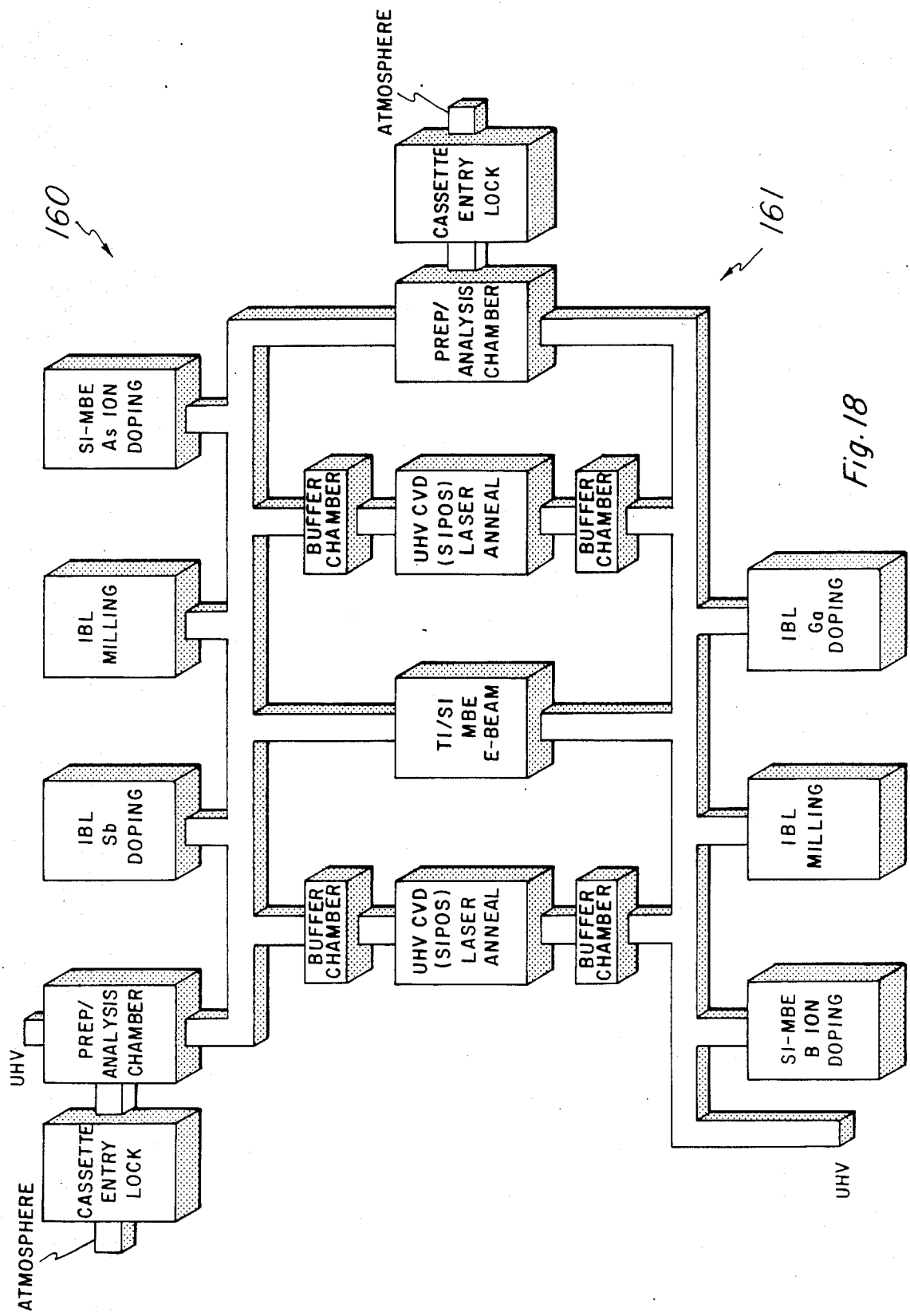
FIG. 18 is a schematic diagram of a processing system having duel processing paths for for making transistor structures by simultaneous reactions in accordance with the invention.

The deposition of the N type region of the previous example can be complemented by a P region in a similar manner. In general, vacuum processing modules can be cascaded in order to produce an arbitrary number of layers by simultaneous reactions with the number of patterned layers simply determined by the number of cascaded vacuum processing modules. FIG. 18 illustrates the cascading of two vacuum processing modules 160 and 161 which can be extrapolated to an arbitrary number. Consequently, the wafers can move throughout the vacuum processing system without interruption under computer control of beam processing with in-situ analysis capability and only exit the high vacuum upon completion of active device processing. Upon completeion of the epitaxial growth, delineation is achieved by two successive anisotropic etches with a form of propanol diluted potassium hydroxide with a patterned CVD silicon nitride as the etch mask. The anisotropic etch proceeds on crystallographic etch fronts so as to preserve precise atomic ordering of the lattice. The etch is performed in a wet chemical bath, and as such, is compatible with large diameter wafers.

During the epitaxial growth in the vacuum processing module, all lithography was by focused ion beams in a maskless manner and particulates are limited by the ultra high vacuum environment. Consequently, there is a minimal number of defects grown into the epitaxial layers. Subsequent to epitaxial growth, all patterning is performed on the planar surface with etched contacts to the various strata layers. The top epitaxial layer need not be used in active device operation. Moreover, generated defects will be constrained near the surface the <111> planes will intersect at a depth determined by the aperture width on the planar surface, which is mall in the case of defects. Consequently, photolithography techniques such as contact or proximity printing can be employed without the usually accompanying defects affecting yield or device performance. Contact and proximity printing have the advantage of a wider field of parallel light, higher processing throughout, and lower costs than projection printing techniques. Contact and proximity printing are, therefore, very suitable for large diameter wafer processing if the sensitivity to masking defects can be eliminated.

The remaining processing is at low temperature, consistent with the overall thermal management of this invention, and employs low cost photolithography techniques that do not perturb atomic periodicity of the underlying area. The "SIPONT" depositions are done at less than 810° C. The gate oxide process is centered around titanium dioxide which is processed at 450° C., approximately the same temperature as metal annealing and polyimide imidization. Subsequent to initial polyimide application, the active area is totally passivated from remaining interconnect processing. The "SIPONT" deposition can also be performed on a platen by UHV CVD techniques. The polyimide and photoresist can be applied to large areas by spray coating. The metals can be deposited by E-beam evaporation in an MBE reactor. Consequently, all processing is compatible with large diameter wafer processing.

Figure 19:
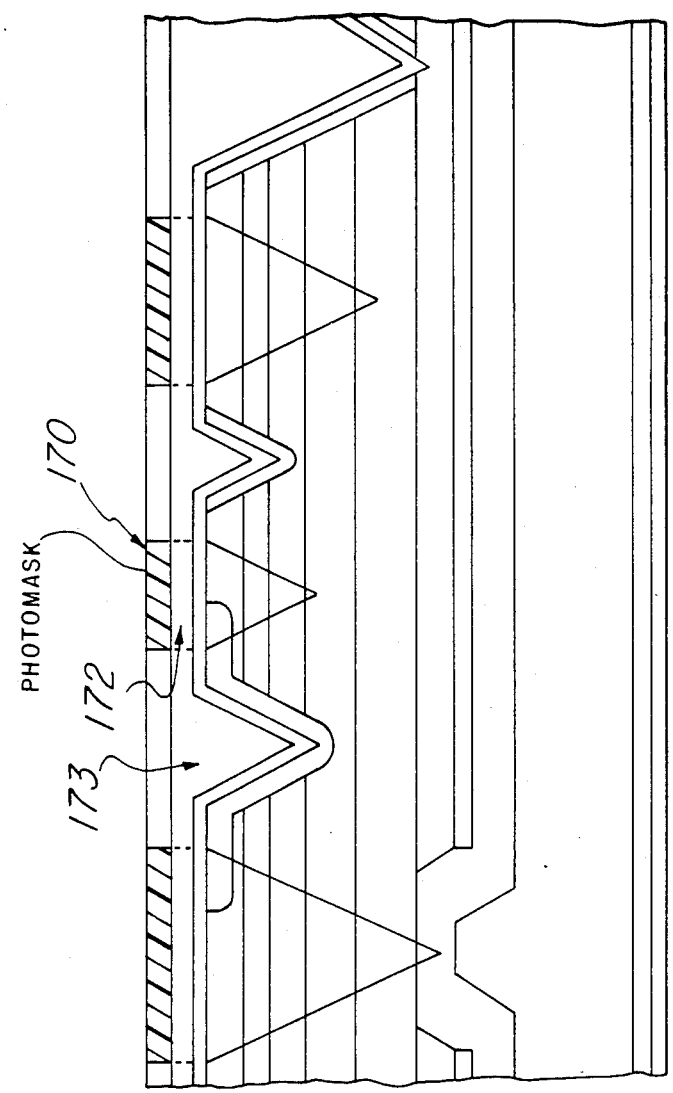
FIG. 19 is a side view of a structure formed in accordance with the invention, showing masking to afford defect desensitation, in the fabrication of transistor structures formed in accordance with the invention.

FIG. 19 illustrates the defect desensitation with respect to masking afforded by this invention. A mask 170 can be brought into contact with the planar surface in order to develop the dark regions of the mask on the planar surface. Since the developed dark regions will be subsequently chemically etched to expose the underlying active regions 172, printed defects in these areas will not be present in final device form. Defects printed in other areas on the planar surface will be constrained near the planar surface, and hence, will not affect the active device regions below the planar surface. Exposed active areas 173 are in V-grooves below the planar surface, and hence, are not affected by mask contact with wafer surface. This printing technique allows efficient exposure of photoresist patterns on the planar surface without focus problems or defect generation by masking operation.

Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

I claim:

1. A method for the fabrication of semiconductor device structures, comprising:
    (a) providing a monocrystalline silicon substrate of crystal orientation;
    (b) by molecular beam deposition, forming on said substrate a first layer of oxygen doped polycrystalline silicon;
    (c) depositing a first layer of transition metal silicide on said polycrystalline silicon layer;
    (d) patterning said deposited layers to re-expose selected substrate areas;
    (e) depositing three monocrystalline layers of silicon over the patterned structure, of alternating conductivity type, to form collector, base, and emitter regions, respectively;
    (f) depositing a second layer of oxygen doped polycrystalline silicon on the third monocrystalline silicon layer;
    (g) depositing a second layer of transition metal silicide on said second polysilicon layer;
    (h) patterning the second polysilicon and second silicide layers to selectively re-expose portions of said third monocrystalline silicon layer;
    (i) epitaxially growing fourth, fifth and sixth layers of monocrystalline silicon, of alternating conductivity type, on the resulting composite from step h;
    (j) selectively masking and anisotropically etching the structure from step i to form a plurality of V-shaped grooves of different depths, controlled by the widths of exposed silicon;
    (k) thermally annealing the resulting composite to modify the grain structure of the oxygen doped polycrystalline silicon layers; and
    (l) completing the structure by passivation and selective metallization of ohmic contact areas.

2. A method as in claim 1 wherein said transition metal is cobalt.

3. A method as in claim 1 wherein said anisotropic etch is a propanol solution of potassium hydroxide.

4. A method as in claim 1 wherein said annealing is done at 1200 degrees C. for 10–20 seconds.

5. A method as in claim 1 wherein said passivation is achieved by depositing a layer of SIPONT.

* * * * *